United States Patent
Sakamoto et al.

(10) Patent No.: US 12,272,577 B2
(45) Date of Patent: Apr. 8, 2025

(54) INSPECTION DEVICE AND PROCESSING SYSTEM

(71) Applicant: HAMAMATSU PHOTONICS K.K., Hamamatsu (JP)

(72) Inventors: Takeshi Sakamoto, Hamamatsu (JP); Takafumi Ogiwara, Hamamatsu (JP); Iku Sano, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 280 days.

(21) Appl. No.: 17/908,288

(22) PCT Filed: Mar. 3, 2021

(86) PCT No.: PCT/JP2021/008266
§ 371 (c)(1),
(2) Date: Aug. 31, 2022

(87) PCT Pub. No.: WO2021/177376
PCT Pub. Date: Sep. 10, 2021

(65) Prior Publication Data
US 2023/0335421 A1  Oct. 19, 2023

(30) Foreign Application Priority Data

Mar. 6, 2020  (JP) ................... 2020-039068

(51) Int. Cl.
*H01L 21/67* (2006.01)
*B23K 26/03* (2006.01)
(Continued)

(52) U.S. Cl.
CPC ...... *H01L 21/67253* (2013.01); *B23K 26/032* (2013.01); *B23K 26/53* (2015.10);
(Continued)

(58) Field of Classification Search
CPC ........ H01L 21/67253; H01L 21/67062; G01N 21/9501; B23K 2103/56; B23K 26/53; B23K 26/032
See application file for complete search history.

(56) References Cited

U.S. PATENT DOCUMENTS

2005/0037272 A1* 2/2005 Tanaka ............... H01L 21/6715
430/311
2008/0037859 A1* 2/2008 Ohkura ............. G01N 21/9501
356/51
(Continued)

FOREIGN PATENT DOCUMENTS

JP  2005-235993 A  9/2005
JP  2009-117776 A  5/2009
(Continued)

OTHER PUBLICATIONS

International Preliminary Report on Patentability mailed Sep. 15, 2022 for PCT/JP2021/008266.

*Primary Examiner* — Nahida Sultana
(74) *Attorney, Agent, or Firm* — Faegre Drinker Biddle & Reath LLP

(57) ABSTRACT

An inspection device includes a laser irradiation unit irradiating a wafer with laser light, a display displaying information, and a control unit. The control unit is constituted to execute deriving of an estimated processing result including information a modified region and a crack extending from the modified region formed on the wafer when the wafer is irradiated with the laser light by the laser irradiation unit on the basis of set recipes (processing conditions), and controlling the display so as to display an estimated processing result image depicting both a graphic image of the wafer and a graphic image of the modified region and the crack in the
(Continued)

wafer in consideration of positions of the modified region and the crack in the wafer derived as the estimated processing result.

11 Claims, 28 Drawing Sheets

(51) Int. Cl.
  *B23K 26/53* (2014.01)
  *B23K 103/00* (2006.01)
  *G01N 21/95* (2006.01)

(52) U.S. Cl.
  CPC ... *G01N 21/9501* (2013.01); *H01L 21/67092* (2013.01); *B23K 2103/56* (2018.08)

(56) References Cited

U.S. PATENT DOCUMENTS

2009/0187354 A1* 7/2009 Ooyama ........... H01L 21/68735
  356/237.2
2009/0278831 A1* 11/2009 Goh ..................... G09G 3/3233
  345/211

FOREIGN PATENT DOCUMENTS

| | | |
|---|---|---|
| JP | 2017-064746 A | 4/2017 |
| JP | 2019-158811 A | 9/2019 |
| TW | 201812286 A | 4/2018 |
| WO | WO-02/022301 A1 | 3/2002 |
| WO | WO-2009/011238 A1 | 1/2009 |
| WO | WO-2010/116917 A1 | 10/2010 |
| WO | WO-2018/168728 A1 | 9/2018 |

* cited by examiner

Fig.16
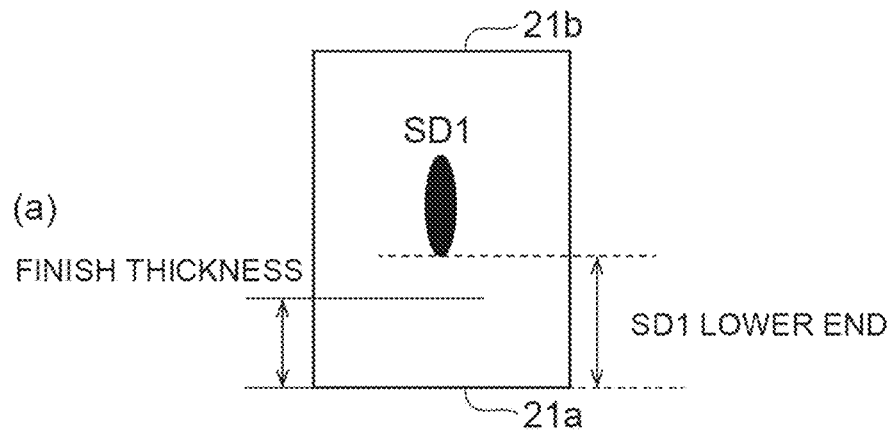
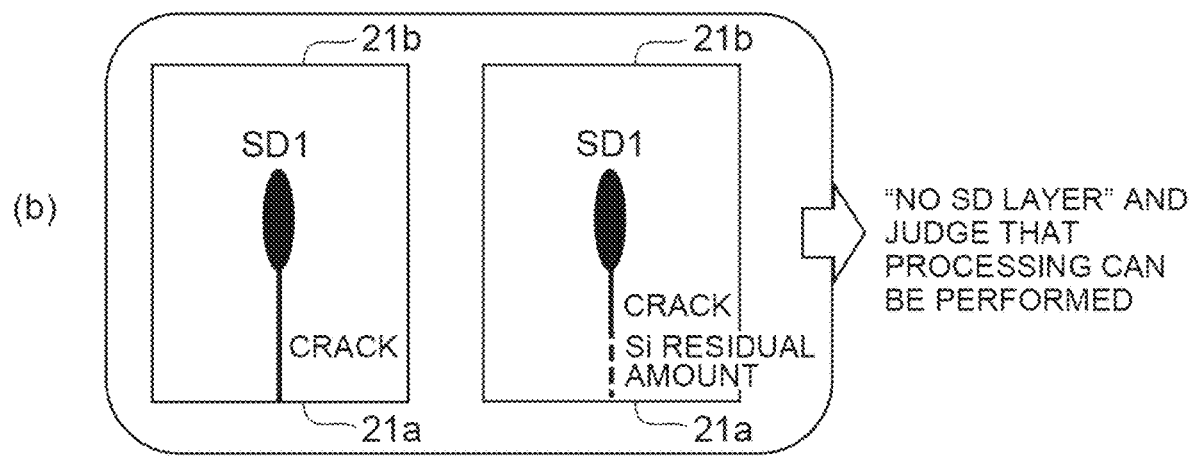
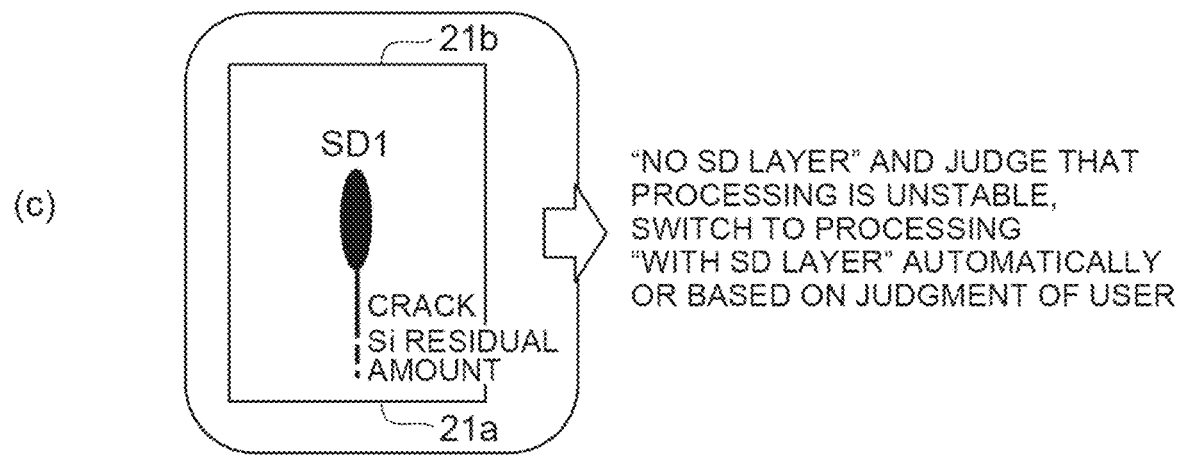

Fig.23

| PROCESSING CONDITION No. | 1 | 2 | 3 | 4 | 5 | 6 | 7 | 8 | 9 | 10 | 11 | ... |
|---|---|---|---|---|---|---|---|---|---|---|---|---|
| ENERGY (µJ) | 21.7 | 21.7 | 21.7 | 16.7 | 26.7 | 21.7 | 21.7 | 21.7 | 21.7 | 21.7 | 21.7 | |
| PULSE WAVEFORM(—) | 1 | 1 | 1 | 1 | 1 | 1 | 1 | 1 | 1 | 2 | 3 | |
| PULSE PITCH | 5 | 6.7 | 8.3 | 6.7 | 6.7 | 6.7 | 6.7 | 6.7 | 6.7 | 6.7 | 6.7 | |
| LIGHT CONCENTRATION STATE(A) | -3 | -3 | -3 | -3 | -3 | -3 | -3 | -3 | -3 | -3 | -3 | |
| LIGHT CONCENTRATION STATE(B) | 6 | 6 | 6 | 6 | 6 | 6 | 6 | 3 | 9 | 6 | 6 | |
| SD LAYER WIDTH (µm) | 25 | 23.5 | 20.5 | 21 | 26.5 | 22.5 | 25 | 24.5 | 21 | 20.5 | 19 | |

INSPECTION DEVICE AND PROCESSING SYSTEM

TECHNICAL FIELD

An aspect of the present invention relates to an inspection device and a treatment system.

BACKGROUND ART

An inspection device for forming a plurality of rows of modified regions inside a semiconductor substrate along each of a plurality of lines by irradiating a wafer with laser light from the other surface side of the semiconductor substrate in order to cut a wafer including a semiconductor substrate and a functional element layer formed on one surface of the semiconductor substrate along each of a plurality of lines is known. The inspection device described in Patent Literature 1 includes an infrared camera, and thus a modified region formed inside a semiconductor substrate, processing damage formed in a functional element layer, or the like can be observed from a rear surface side of the semiconductor substrate.

CITATION LIST

Patent Literature

[Patent Literature 1] Japanese Unexamined Patent Publication No. 2017-64746

SUMMARY OF INVENTION

Technical Problem

In such an inspection device described above, in a preliminary stage of irradiating a wafer with laser light (performing laser processing of a wafer), there is a need to determine processing conditions including irradiation conditions of laser light on the basis of information of a wafer, a laser processing target, or the like. In order to appropriately determine the processing conditions, for example, it is necessary to derive appropriate processing conditions or the like by repeating laser processing treatment while a user adjusts the processing conditions. There is a demand for efficiently determining such processing conditions and easily performing processing treatment.

An aspect of the present invention has been made in consideration of the foregoing circumstances, and an object thereof is to provide an inspection device and a treatment system capable of efficiently determining processing conditions and easily performing processing desired by a user.

Solution to Problem

An inspection device according to an aspect of the present invention includes an irradiation unit configured to irradiate a wafer with laser light, a display unit configured to display information, and a control unit. The control unit is constituted to execute deriving of an estimated processing result including information of a modified region and a crack extending from the modified region formed on the wafer when the wafer is irradiated with the laser light by the irradiation unit on the basis of set processing conditions, and controlling of the display unit so as to display an estimated processing result image depicting both a graphic image of the wafer and a graphic image of the modified region and the crack in the wafer in consideration of positions of the modified region and the crack in the wafer derived as the estimated processing result.

In the inspection device according to the aspect of the present invention, an estimated processing result image depicting both a wafer, and a modified region and a crack of the wafer are displayed in consideration of an estimated processing result including information of a modified region and a crack extending from the modified region formed on the wafer through irradiation with laser light on the basis of set processing conditions. Since an estimated processing result image is displayed in this manner, when a wafer is processed in accordance with set processing conditions, it is possible to inform a user how the wafer is processed (how a modified region and a crack are formed). Consequently, a user can visually confirm the estimated processing result image and can determine whether to perform actual processing without any change or to change the processing conditions. Accordingly, it is possible to efficiently determine processing conditions and easily perform processing desired by a user.

The inspection device described above may further include an input unit configured to receive an input of information. The input unit may receive an input of information related to setting of the processing conditions. The control unit may set the processing conditions on the basis of information related to setting of the processing conditions received by the input unit. Accordingly, since the processing conditions are set on the basis of information received from a user, for example, it is possible to set appropriate processing conditions in consideration of information of a wafer, a laser processing target with respect to the wafer, and the like.

The control unit may control the display unit so as to display both the processing conditions and the estimated processing result image associated with each other. Accordingly, it is possible to visually inform a user of a certain processing result obtained when processing is performed under certain processing conditions.

The input unit may receive an input of first corrected information related to correction of positions of the modified region and the crack displayed as the estimated processing result image in a state where the estimated processing result image is displayed by the display unit. The control unit may correct the estimated processing result on the basis of the first corrected information and correct the processing conditions so as to obtain the estimated processing result after correction, and may control the display unit so as to display both the processing conditions after correction and the estimated processing result image based on the estimated processing result after correction associated with each other. Accordingly, it is possible to easily correct the processing conditions on the basis of a correction instruction for an estimated processing result image from a user who has confirmed the estimated processing result image. When a correction instruction for an estimated processing result image is output so as to obtain a desired processing result, since processing conditions are automatically corrected to processing conditions corresponding thereto, a user can easily perform desired processing.

The input unit may receive an input of second corrected information related to correction of the processing conditions in a state where the processing conditions are displayed by the display unit. The control unit may correct the processing conditions on the basis of the second corrected information and correct the estimated processing result on the basis of the processing conditions after correction, and may control the display unit so as to display both the processing conditions after correction and the estimated processing result image based on the estimated processing result after correction associated with each other. Accordingly, it is possible to easily correct the processing conditions on the basis of a correction instruction from a user, and it is possible to appropriately display an estimated processing result image in the case of the processing conditions after correction.

The inspection device described above may further include an imaging unit configured to image the wafer. The control unit may be constituted to further execute controlling of the irradiation unit so as to form a modified region and a crack extending from the modified region in the wafer by irradiating the wafer with the laser light, acquiring of a laser processing result including information of a modified region and a crack extending from the modified region formed on the wafer through irradiation with the laser light by outputting light having transmission properties with respect to the wafer and controlling the imaging unit so as to image the wafer, and controlling of the display unit so as to display both the estimated processing result image and the laser processing result associated with each other. Accordingly, it is possible to display both an image of processing estimated from the processing conditions and an actual laser processing result, and it is possible for a user to easily judge whether or not to change the processing conditions, and the like.

The control unit may control the display unit so as to display the estimated processing result image of a cross section perpendicular to a processing line irradiated with the laser light. Accordingly, it is possible for a user to confirm an estimated processing result image of a cross section perpendicular to the processing line.

The control unit may control the display unit so as to display the estimated processing result image of a cross section horizontal to a processing line irradiated with the laser light. Accordingly, it is possible for a user to confirm an estimated processing result image of a cross section horizontal to the processing line.

An inspection device according to another aspect of the present invention includes an irradiation unit configured to irradiate a wafer with laser light, and a control unit. The control unit is constituted to execute deriving of an estimated processing result including information of a modified region and a crack extending from the modified region formed on the wafer when the wafer is irradiated with the laser light by the irradiation unit on the basis of set processing conditions, and outputting of an estimated processing result image depicting both a graphic image of the wafer and a graphic image of the modified region and the crack in the wafer in consideration of positions of the modified region and the crack in the wafer derived as the estimated processing result. Accordingly, for example, even in such a case where the inspection device has no display unit, it is possible to display an estimated processing result image or the like using an external device or the like which can communicate with the inspection device.

A treatment system according to another aspect of the present invention is a treatment system performing communication between an inspection device and a display device. The inspection device derives an estimated processing result including information of a modified region and a crack extending from the modified region formed when a wafer is irradiated with laser light on the basis of set processing conditions and outputs an estimated processing result image depicting both a graphic image of the wafer and a graphic image of the modified region and the crack in the wafer toward the display device in consideration of positions of the modified region and the crack in the wafer derived as the estimated processing result. The display device displays the estimated processing result image output by the inspection device. According to such a treatment system, it is possible to appropriately display an estimated processing result image output by the inspection device using the display device.

An inspection device according to another aspect of the present invention includes an irradiation unit configured to irradiate a wafer with laser light, a display unit configured to display information, and a control unit. The control unit is constituted to execute deriving of an estimated processing result including information of a modified region and a crack extending from the modified region formed on the wafer when the wafer is irradiated with the laser light by the irradiation unit on the basis of set processing conditions, and controlling of the display unit so as to display information related to the estimated processing result.

Advantageous Effects of Invention

According to the aspect of the present invention, it is possible to efficiently determine processing conditions and easily perform processing desired by a user.

BRIEF DESCRIPTION OF DRAWINGS

FIG. 16 is an explanatory view of setting of a finished cross section.

FIG. 23 is an example of a database related to derivation of a wafer thickness.

DESCRIPTION OF EMBODIMENT

Hereinafter, an embodiment of the present invention will be described in detail with reference to the drawings. In each of the drawings, the same reference signs are applied to parts which are the same or corresponding, and duplicate description thereof will be omitted.

[Constitution of Inspection Device]

Figure 1:
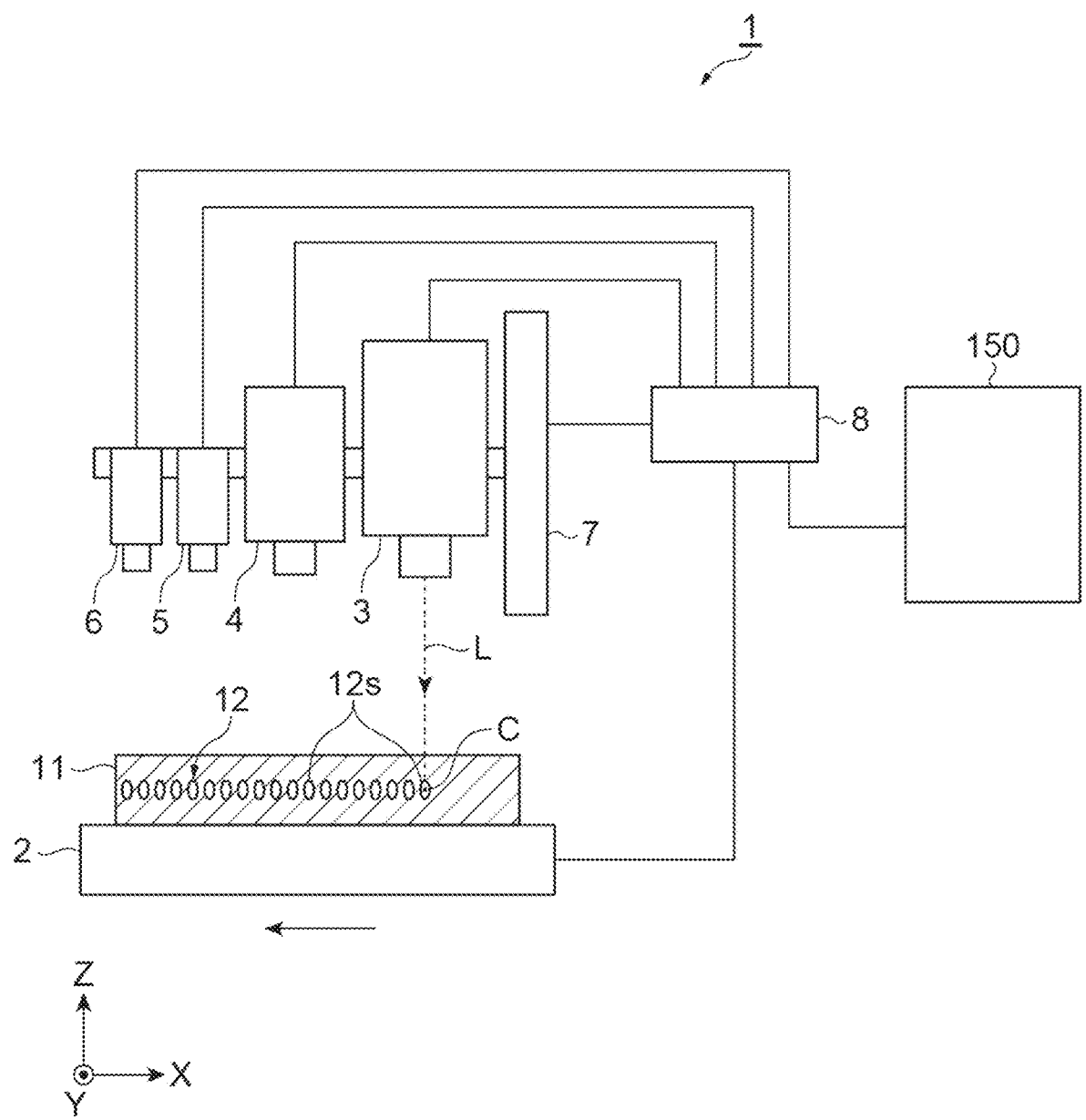
FIG. 1 is a view of a constitution of an inspection device of an embodiment.

As illustrated in FIG. 1, an inspection device 1 includes a stage 2, a laser irradiation unit 3 (irradiation unit), a plurality of imaging units 4, 5, and 6, a drive unit 7, a control unit 8, and a display 150 (input unit/display unit). The inspection device 1 is a device forming a modified region 12 in an object 11 by irradiating the object 11 with laser light L.

For example, the stage 2 supports the object 11 by adsorbing a film bonded to the object 11. The stage 2 can move in each of an X direction and a Y direction and can rotate with an axis parallel to a Z direction as a centerline thereof. The X direction and the Y direction are respectively a first horizontal direction and a second horizontal direction perpendicular to each other, and the Z direction is a vertical direction.

The laser irradiation unit 3 concentrates the laser light L having transmission properties with respect to the object 11 and irradiates the object 11 therewith. When the laser light L is concentrated inside the object 11 supported by the stage 2, the laser light L is particularly absorbed in a part corresponding to a light concentration point C of the laser light L, and the modified region 12 is formed inside the object 11.

The modified region 12 is a region of which a density, a refractive index, a mechanical strength, or another physical characteristic differs from that of non-modified regions therearound. Examples of the modified region 12 include a melting treatment region, a crack region, an insulation breakdown region, and a refractive index change region. The modified region 12 has characteristics causing a crack to be likely to extend from the modified region 12 to an incidence side of the laser light L and a side opposite thereto. Such characteristics of the modified region 12 are utilized for cutting the object 11.

As an example, when the stage 2 is moved in the X direction and the light concentration point C is relatively moved in the X direction with respect to the object 11, a plurality of modified spots 12s are formed side by side in a row in the X direction. One modified spot 12s is formed due to irradiation with one pulse of the laser light L. One row of the modified region 12 is an aggregation of a plurality of modified spots 12s arranged side by side in a row. Modified spots 12s adjacent to each other may be connected to each other or may be separated from each other due to a relative movement speed of the light concentration point C with respect to the object 11 and a repetition frequency of the laser light L.

The imaging unit 4 images the modified region 12 formed in the object 11 and a tip of a crack extending from the modified region 12.

The imaging unit 5 and the imaging unit 6 image the object 11 supported by the stage 2 using light transmitted through the object 11 under control of the control unit 8. As an example, an image obtained through imaging of the imaging units 5 and 6 is used for alignment of an irradiation position of the laser light L.

The drive unit 7 supports the laser irradiation unit 3 and the plurality of imaging units 4, 5, and 6. The drive unit 7 moves the laser irradiation unit 3 and the plurality of imaging units 4, 5, and 6 in the Z direction.

The control unit 8 controls operation of the stage 2, the laser irradiation unit 3, the plurality of imaging units 4, 5, and 6, and the drive unit 7. The control unit 8 is constituted as a computer device including a processor, a memory, a storage, a communication device, and the like. In the control unit 8, the processor executes software (program) read in the memory or the like and controls reading and writing of data in the memory and the storage and communication by the communication device.

The display 150 functions as an input unit receiving an input of information from a user and functions as a display unit displaying information to a user.

[Constitution of Object]

Figure 2:
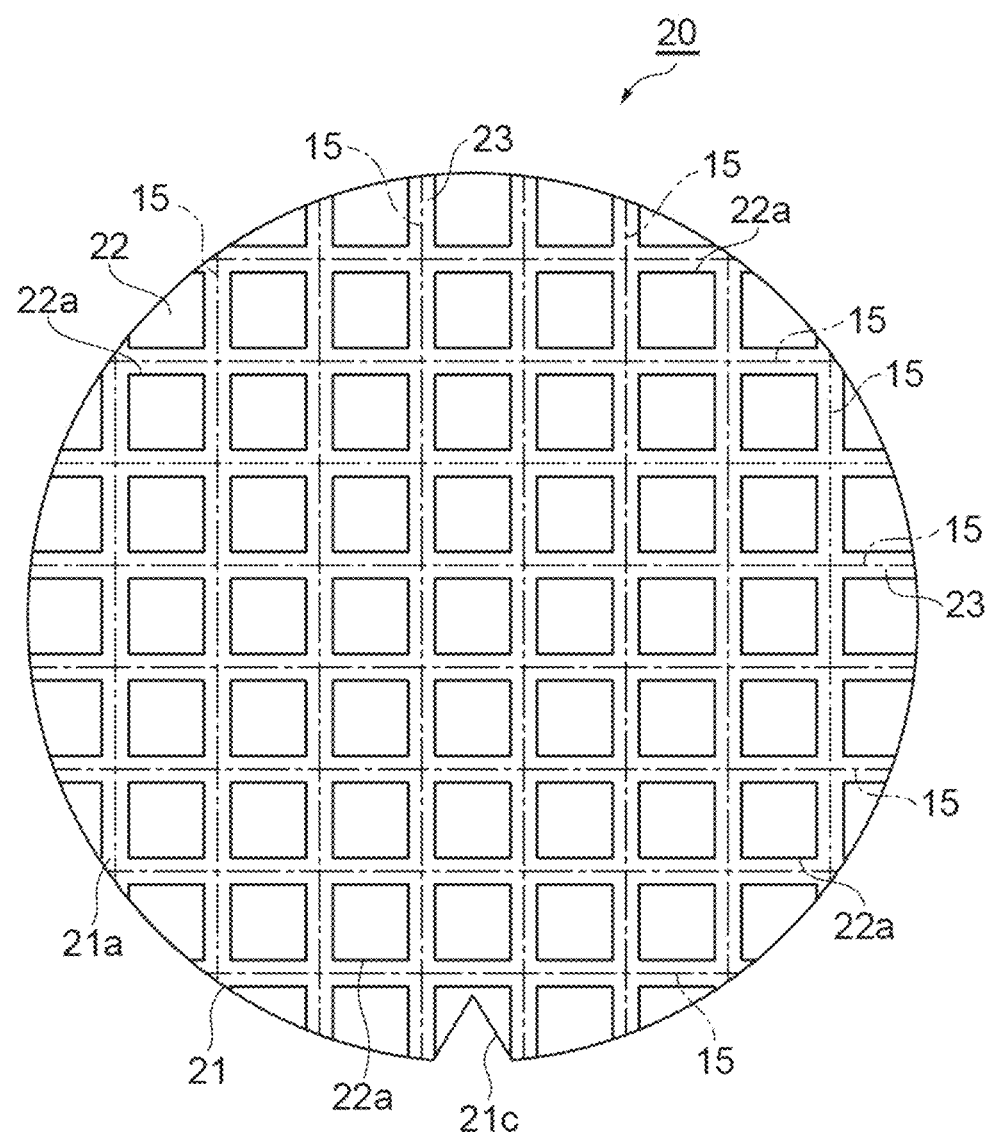
FIG. 2 is a plan view of a wafer of the embodiment.
Figure 3:
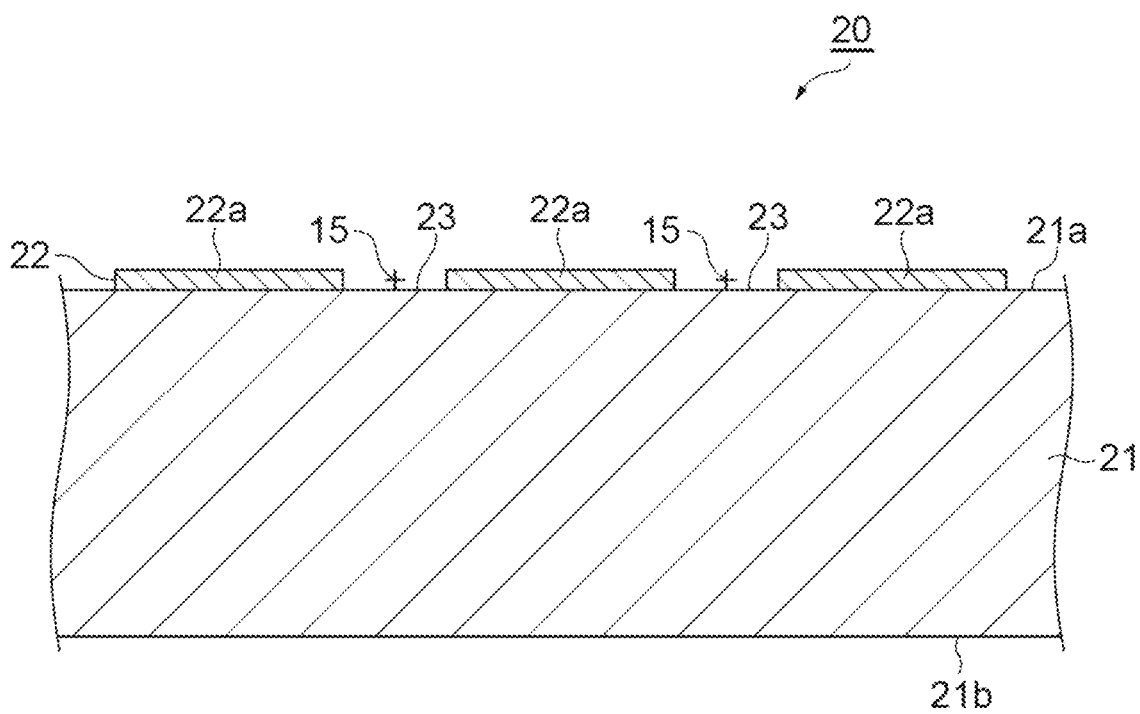
FIG. 3 is a cross-sectional view of a part of the wafer illustrated in FIG. 2.

As illustrated in FIGS. 2 and 3, the object 11 of the present embodiment is a wafer 20. The wafer 20 includes a semiconductor substrate 21 and a functional element layer 22. In the present embodiment, the wafer 20 will be described as having the functional element layer 22, but the wafer 20 may or may not have the functional element layer 22 or may be a bare wafer. The semiconductor substrate 21 has a front surface 21a (second surface) and a rear surface 21b (first surface). For example, the semiconductor substrate 21 is a silicon substrate. The functional element layer 22 is formed on the front surface 21a of the semiconductor substrate 21. The functional element layer 22 includes a plurality of functional elements 22a arrayed in a two-dimensional manner along the front surface 21a. Examples of the functional elements 22a include light receiving elements such as photodiodes, light emitting elements such as laser diodes, and circuit elements such as memories. The functional elements 22a may be constituted in a three-dimensional manner in which a plurality of layers are stacked. The semiconductor substrate 21 is provided with a notch 21c indicating a crystal orientation, but an orientation flat may be provided therein in place of the notch 21c.

The wafer 20 is cut for each of the functional elements 22a along each of a plurality of lines 15. The plurality of lines 15 pass through areas between the plurality of functional elements 22a when viewed in a thickness direction of the wafer 20. More specifically, the lines 15 pass through centers of street regions 23 (centers in a width direction) when viewed in the thickness direction of the wafer 20. The street regions 23 extend through areas between functional elements 22a adjacent to each other in the functional element layer 22. In the present embodiment, the plurality of functional elements 22a are arrayed in a matrix shape along the front surface 21a, and the plurality of lines 15 are set in a lattice shape. The lines 15 are virtual lines, but they may be actually drawn lines.

[Constitution of Laser Irradiation Unit]

Figure 4:
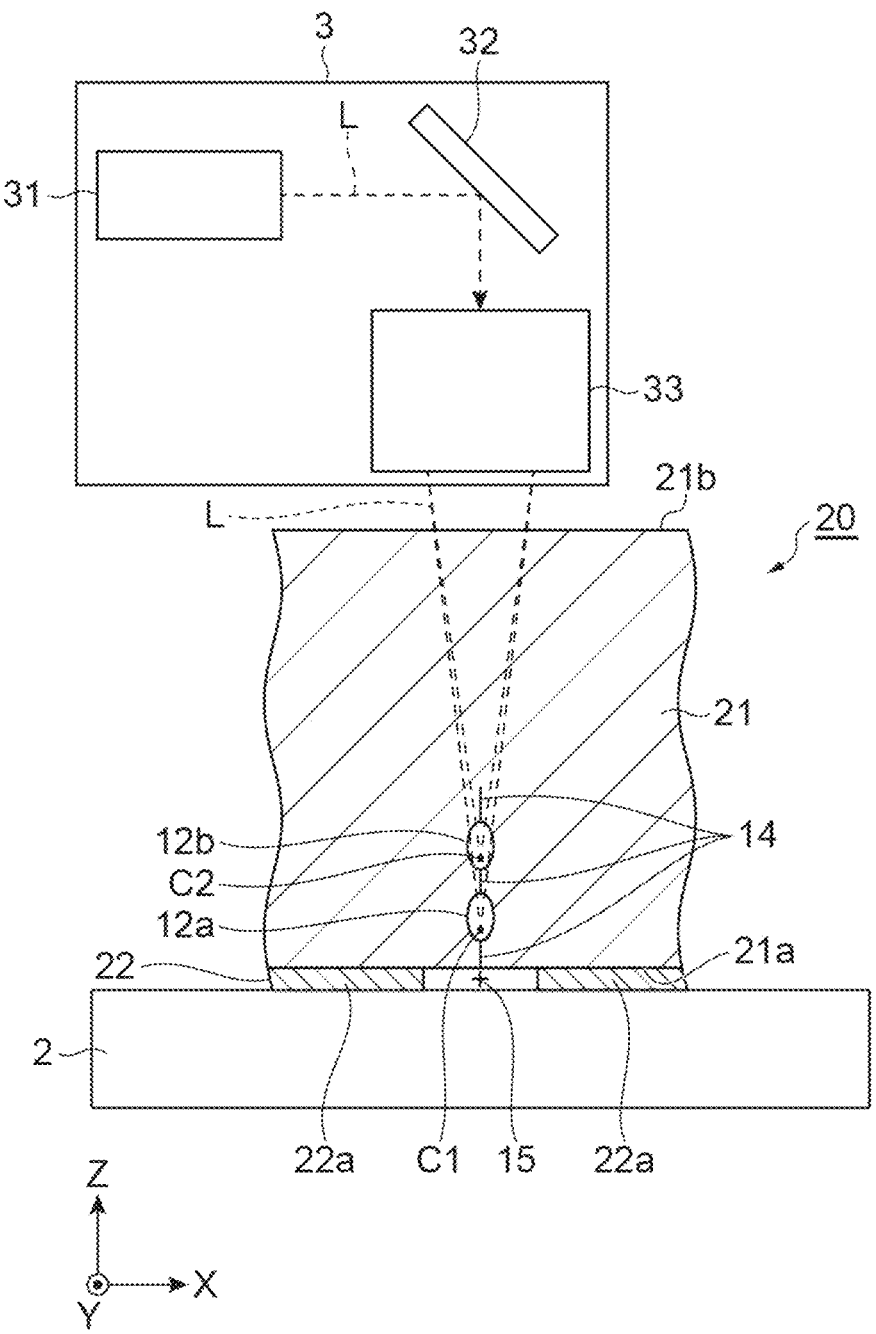
FIG. 4 is a view of a constitution of a laser irradiation unit illustrated in FIG. 1.

As illustrated in FIG. 4, the laser irradiation unit 3 has a light source 31, a spatial light modulator 32, and a light concentration lens 33. For example, the light source 31 outputs the laser light L by a pulse oscillation method. The spatial light modulator 32 modulates the laser light L output from the light source 31. For example, the spatial light modulator 32 is a spatial light modulator (SLM) using liquid crystal on silicon (LCOS). The light concentration lens 33 concentrates the laser light L modulated by the spatial light modulator 32. The light concentration lens 33 may be a correction ring lens.

In the present embodiment, the laser irradiation unit 3 forms modified regions 12a and 12b in two rows inside the semiconductor substrate 21 along each of the plurality of lines 15 by irradiating the wafer with the laser light L from the rear surface 21b side of the semiconductor substrate 21 along each of the plurality of lines 15. In the modified regions 12a and 12b in two rows, the modified region 12a is a modified region closest to the front surface 21a. In the modified regions 12a and 12b in two rows, the modified region 12b is a modified region closest to the modified region 12a and is a modified region closest to the rear surface 21b.

The modified regions 12a and 12b in two rows are adjacent to each other in the thickness direction (Z direction) of the wafer 20. The modified regions 12a and 12b in two rows are formed when two light concentration points C1 and C2 are relatively moved along the lines 15 with respect to the semiconductor substrate 21. For example, the laser light L is modulated by the spatial light modulator 32 such that the light concentration point C2 is positioned on a rear side in a forward movement direction and the incidence side of the laser light L with respect to the light concentration point C1. Regarding formation of a modified region, it may have a single focal point or multiple focal points and it may have one pass or a plurality of passes.

The laser irradiation unit 3 irradiates the wafer 20 with the laser light L from the rear surface 21b side of the semiconductor substrate 21 along each of the plurality of lines 15. As an example, with respect to the semiconductor substrate 21 which is a single crystal silicon substrate having a thickness of 775 μm, while the two light concentration points C1 and C2 are respectively focused on a position of 54 μm and a position of 128 μm from the front surface 21a, the wafer 20 is irradiated with the laser light L from the rear surface 21b side of the semiconductor substrate 21 along each of the plurality of lines 15. At this time, for example, in the case of a condition in which a crack 14 across the modified regions 12a and 12b in two rows reaches the front surface 21a of the semiconductor substrate 21, a wavelength of the laser light L is set to 1,099 nm, a pulse width is set to 700 nsec, and a repetition frequency is set to 120 kHz. In addition, an output of the laser light L at the light concentration point C1 is set to 2.7 W, an output of the laser light L at the light concentration point C2 is set to 2.7 W, and relative movement speeds of the two light concentration points C1 and C2 with respect to the semiconductor substrate 21 are set to 800 mm/sec.

Formation of such modified regions 12a and 12b in two rows and the crack 14 is performed in the following case. That is, in a latter step, for example, they are formed in a case where the semiconductor substrate 21 is thinned by grinding the rear surface 21b of the semiconductor substrate 21, the crack 14 is exposed on the rear surface 21b, and the wafer 20 is cut into a plurality of semiconductor devices along each of the plurality of lines 15.

[Constitution of Inspection Imaging Unit]

Figure 5:
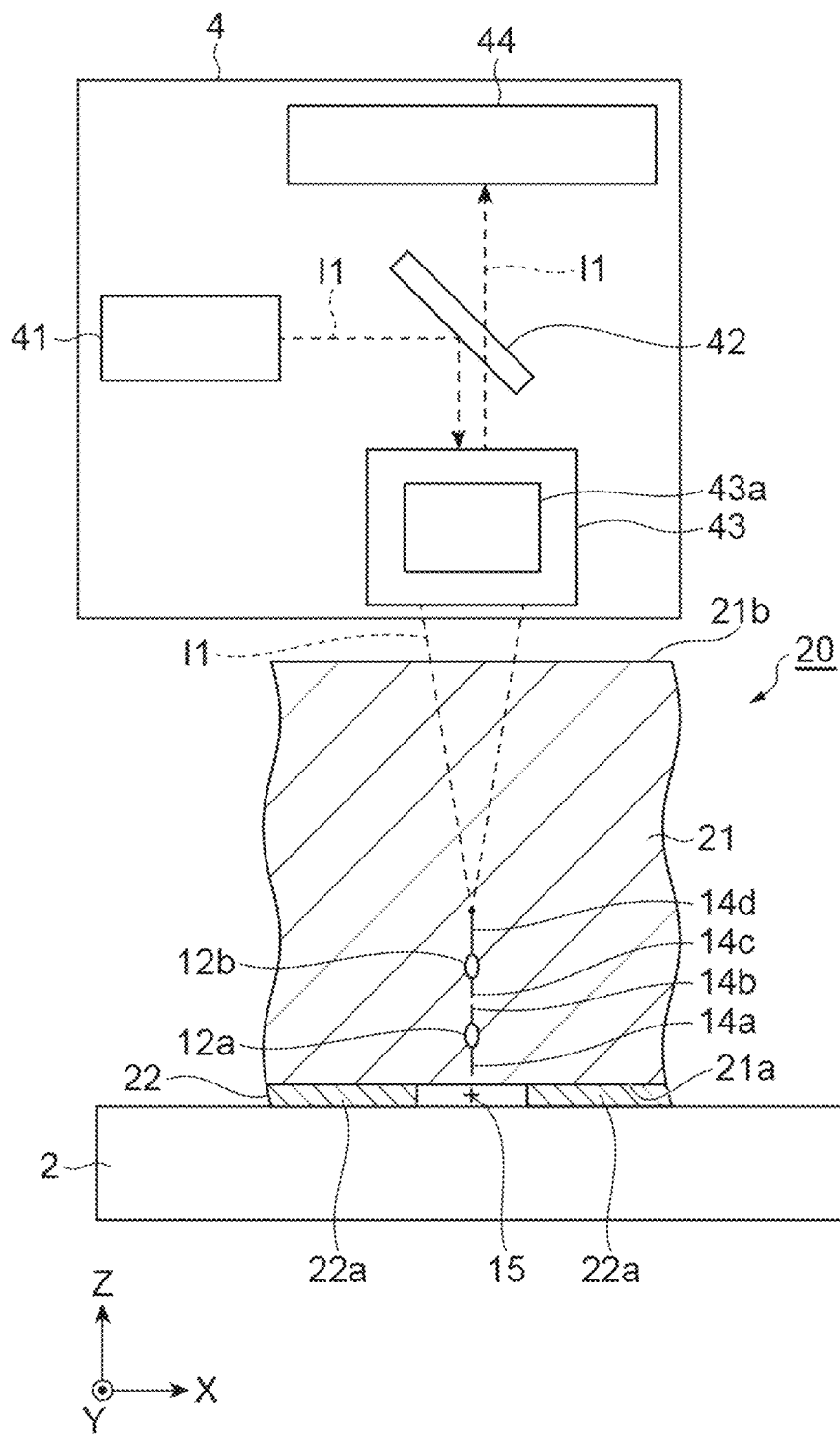
FIG. 5 is a view of a constitution of an inspection imaging unit illustrated in FIG. 1.

As illustrated in FIG. 5, the imaging unit 4 (imaging unit) has a light source 41, a mirror 42, an object lens 43, and a light detection unit 44. The imaging unit 4 images the wafer 20. The light source 41 outputs light I1 having transmission properties with respect to the semiconductor substrate 21. For example, the light source 41 is constituted of a halogen lamp and a filter and outputs the light I1 of a near infrared region. The light I1 output from the light source 41 is reflected by the mirror 42, passes through the object lens 43, and is used for irradiating the wafer 20 from the rear surface 21b side of the semiconductor substrate 21. At this time, the stage 2 supports the wafer in which the modified regions 12a and 12b in two rows are formed as described above.

The object lens 43 allows the light I1 reflected by the front surface 21a of the semiconductor substrate 21 to pass therethrough. Namely, the object lens 43 allows the light I1 propagated through the semiconductor substrate 21 to pass therethrough. For example, a numerical aperture (NA) of the object lens 43 is 0.45 or higher. The object lens 43 has a correction ring 43a. For example, the correction ring 43a corrects an aberration generated in the light I1 inside the semiconductor substrate 21 by adjusting a distance between a plurality of lenses constituting the object lens 43. A means for correcting an aberration is not limited to the correction ring 43a, and a different correction means such as a spatial light modulator may be adopted. The light detection unit 44 detects the light I1 which has been transmitted through the object lens 43 and the mirror 42. For example, the light detection unit 44 is constituted of an InGaAs camera and detects the light I1 of a near infrared region. A means for detecting (imaging) the light I1 of a near infrared region is not limited to an InGaAs camera, and a different imaging means such as a transmission-type confocal microscope may be adopted as long as it performs transmission-type imaging.

The imaging unit 4 can image a tip of each of the modified regions 12a and 12b in two rows and each of a plurality of cracks 14a, 14b, 14c, and 14d (details will be described below). The crack 14a is a crack extending from the modified region 12a to the front surface 21a side. The crack 14b is a crack extending from the modified region 12a to the rear surface 21b side. The crack 14c is a crack extending from the modified region 12b to the front surface 21a side. The crack 14d is a crack extending from the modified region 12b to the rear surface 21b side.

[Constitution of Alignment Correction Imaging Unit]

Figure 6:
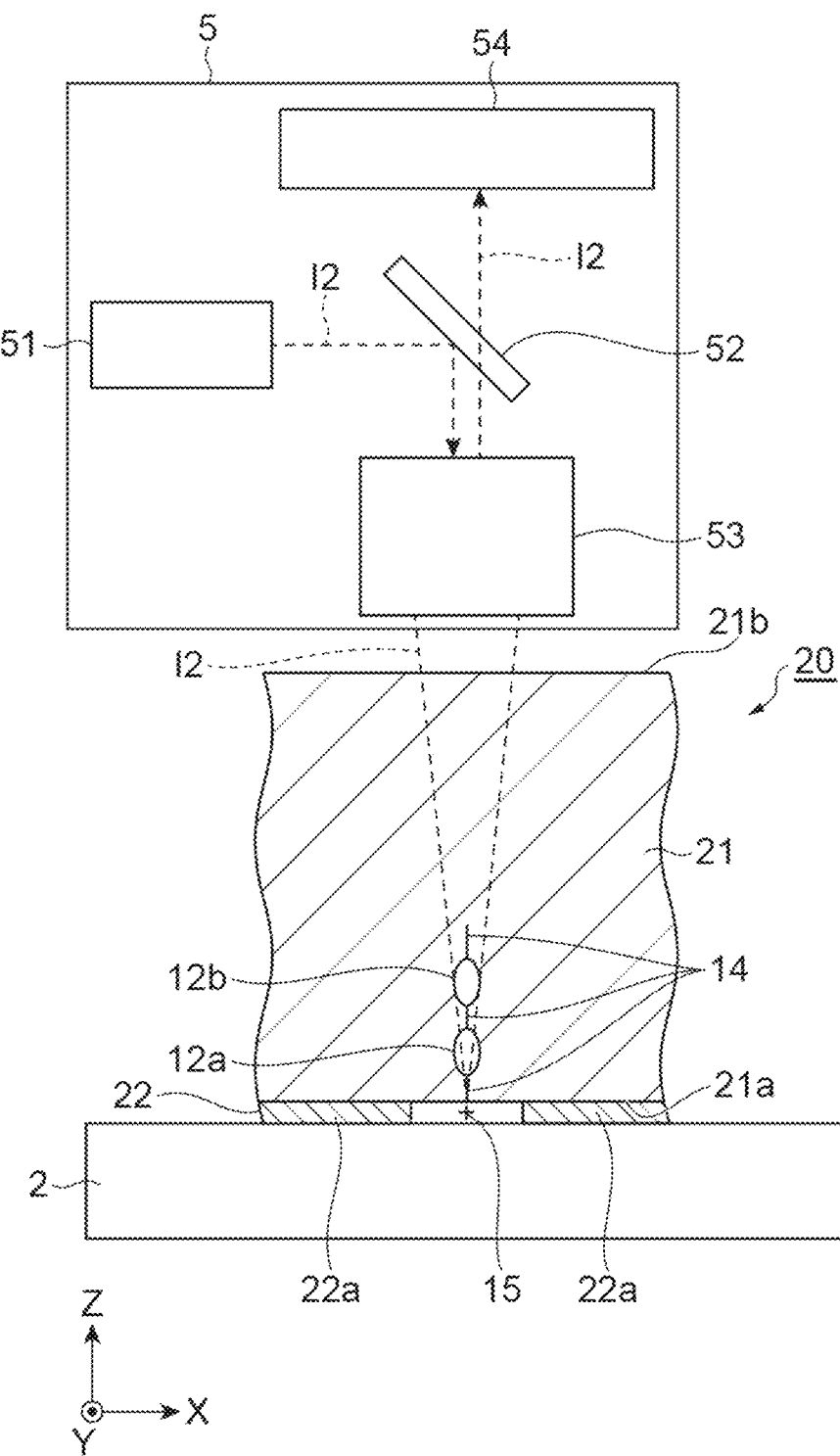
FIG. 6 is a view of a constitution of an alignment correction imaging unit illustrated in FIG. 1.

As illustrated in FIG. 6, the imaging unit 5 has a light source 51, a mirror 52, a lens 53, and a light detection unit 54. The light source 51 outputs light I2 having transmission properties with respect to the semiconductor substrate 21. For example, the light source 51 is constituted of a halogen lamp and a filter and outputs the light I2 of a near infrared region. The light source 51 may be shared as the light source 41 of the imaging unit 4. The light I2 output from the light source 51 is reflected by the mirror 52, passes through the lens 53, and is used for irradiating the wafer 20 from the rear surface 21b side of the semiconductor substrate 21.

The lens 53 allows the light I2 reflected by the front surface 21a of the semiconductor substrate 21 to pass therethrough. Namely, the lens 53 allows the light I2 propagated through the semiconductor substrate 21 to pass therethrough. A numerical aperture of the lens 53 is 0.3 or lower.

That is, the numerical aperture of the object lens 43 of the imaging unit 4 is higher than the numerical aperture of the lens 53. The light detection unit 54 detects the light 12 which has passed through the lens 53 and the mirror 52. For example, the light detection unit 55 is constituted of an InGaAs camera and detects the light 12 of a near infrared region.

Under control of the control unit 8, the imaging unit 5 images the functional element layer 22 by irradiating the wafer 20 with the light 12 from the rear surface 21b side and detecting the light 12 returning from the front surface 21a (functional element layer 22). In addition, similarly, under control of the control unit 8, the imaging unit 5 acquires an image of a region including the modified regions 12a and 12b by irradiating the wafer 20 with the light 12 from the rear surface 21b side and detecting the light 12 returning from formation positions of the modified regions 12a and 12b in the semiconductor substrate 21. These images are used for alignment of the irradiation position of the laser light L. The imaging unit 6 has a constitution similar to that of the imaging unit 5 except that the lens 53 has a lower magnification (for example, 6 times in the imaging unit 5, and 1.5 times in the imaging unit 6) and is used for alignment in a manner similar to that of the imaging unit 5.

[Imaging Principle of Inspection Imaging Unit]

Figure 7:
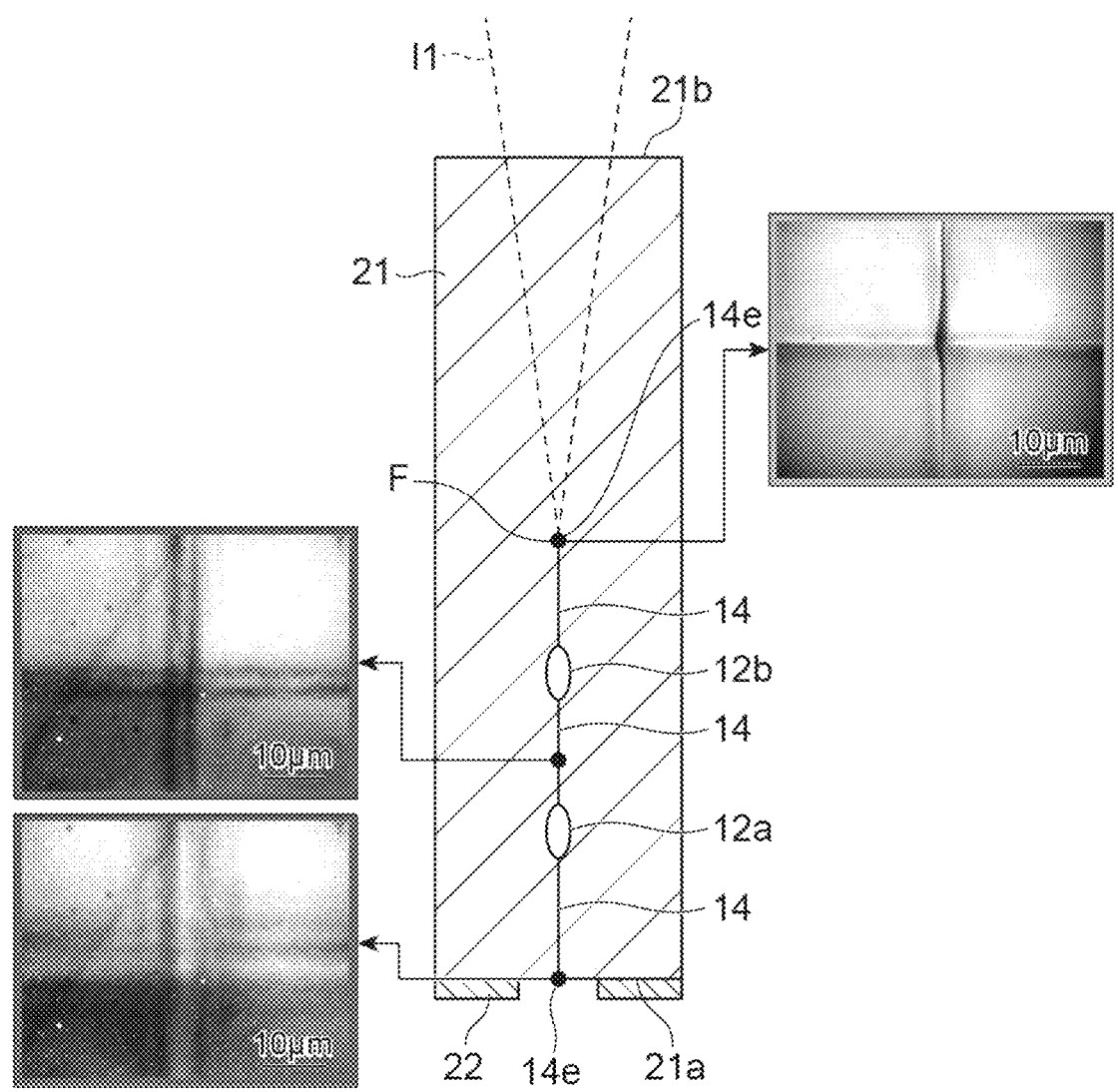
FIG. 7 is a cross-sectional view of a wafer for describing an imaging principle of the inspection imaging unit illustrated in FIG. 5 and is images at respective locations taken by the inspection imaging unit.

Using the imaging unit 4 illustrated in FIG. 5, as illustrated in FIG. 7, a focal point F (a focal point of the object lens 43) is moved from the rear surface 21b side toward the front surface 21a side with respect to the semiconductor substrate 21 in which the crack 14 across the modified regions 12a and 12b in two rows has reached the front surface 21a. In this case, when the focal point F is focused from the rear surface 21b side on a tip 14e of the crack 14 extending from the modified region 12b to the rear surface 21b side, the tip 14e can be confirmed (the image on the right side in FIG. 7). However, even if the focal point F is focused from the rear surface 21b side on the crack 14 itself and the tip 14e of the crack 14 which has reached the front surface 21a, these cannot be confirmed (the image on the left side in FIG. 7). When the focal point F is focused from the rear surface 21b side on the front surface 21a of the semiconductor substrate 21, the functional element layer 22 can be confirmed.

Figure 8:
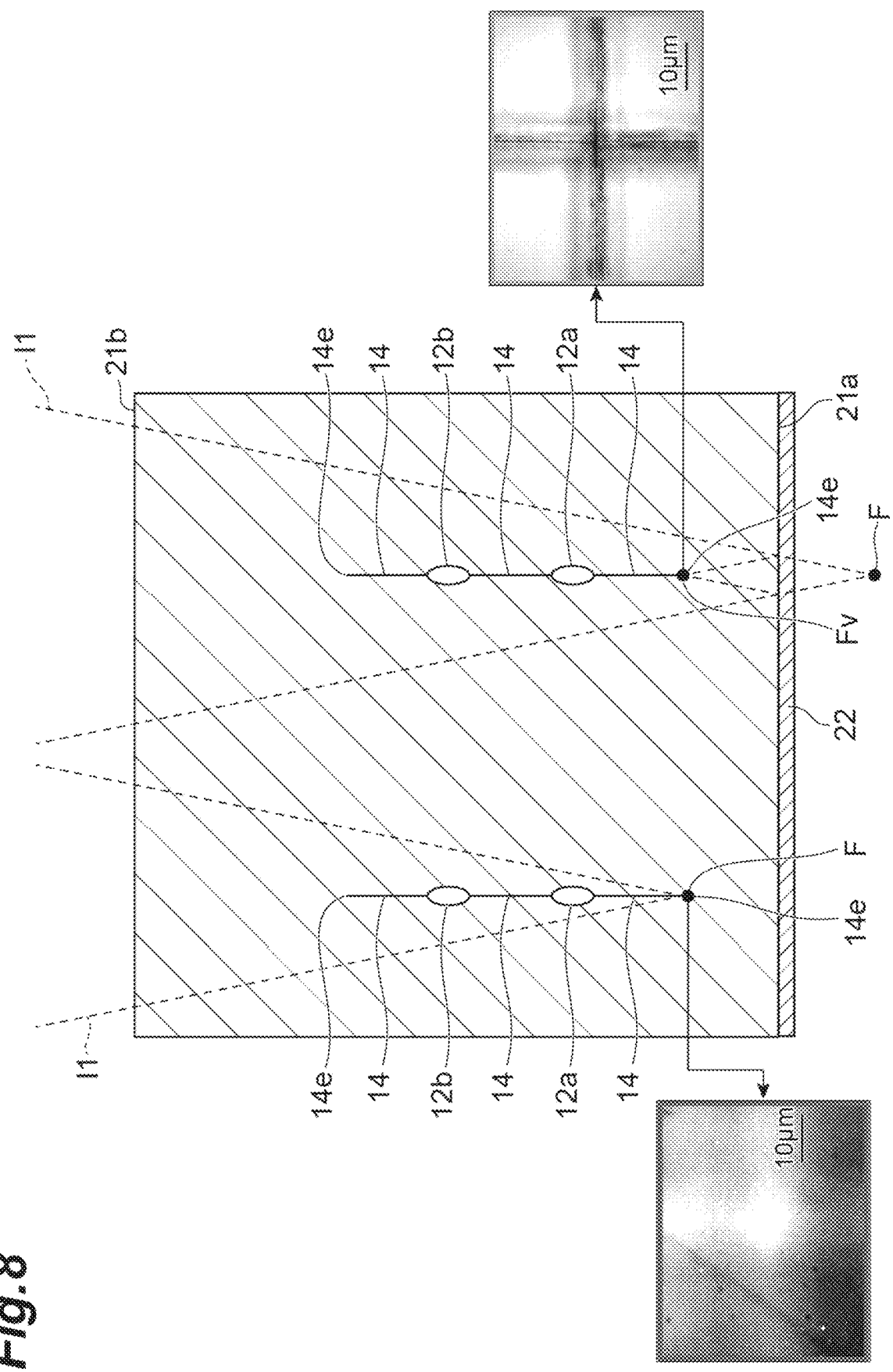
FIG. 8 is another cross-sectional view of a wafer for describing an imaging principle of the inspection imaging unit illustrated in FIG. 5 and is images at respective locations taken by the inspection imaging unit.

In addition, using the imaging unit 4 illustrated in FIG. 5, as illustrated in FIG. 8, the focal point F is moved from the rear surface 21b side toward the front surface 21a side with respect to the semiconductor substrate 21 in which the crack 14 across the modified regions 12a and 12b in two rows has not reached the front surface 21a. In this case, even if the focal point F is focused from the rear surface 21b side on the tip 14e of the crack 14 extending from the modified region 12a to the front surface 21a side, the tip 14e cannot be confirmed (the image on the left side in FIG. 8). However, when the focal point F is focused from the rear surface 21b side on a region on a side opposite to the rear surface 21b with respect to the front surface 21a (that is, a region on the functional element layer 22 side with respect to the front surface 21a), and when a virtual focal point Fv symmetrical to the focal point F with respect to the front surface 21a is positioned at the tip 14e, the tip 14e can be confirmed (the image on the right side in FIG. 8). The virtual focal point Fv is a point symmetrical to the focal point F in consideration of the refractive index of the semiconductor substrate 21 with respect to the front surface 21a.

Figure 9:
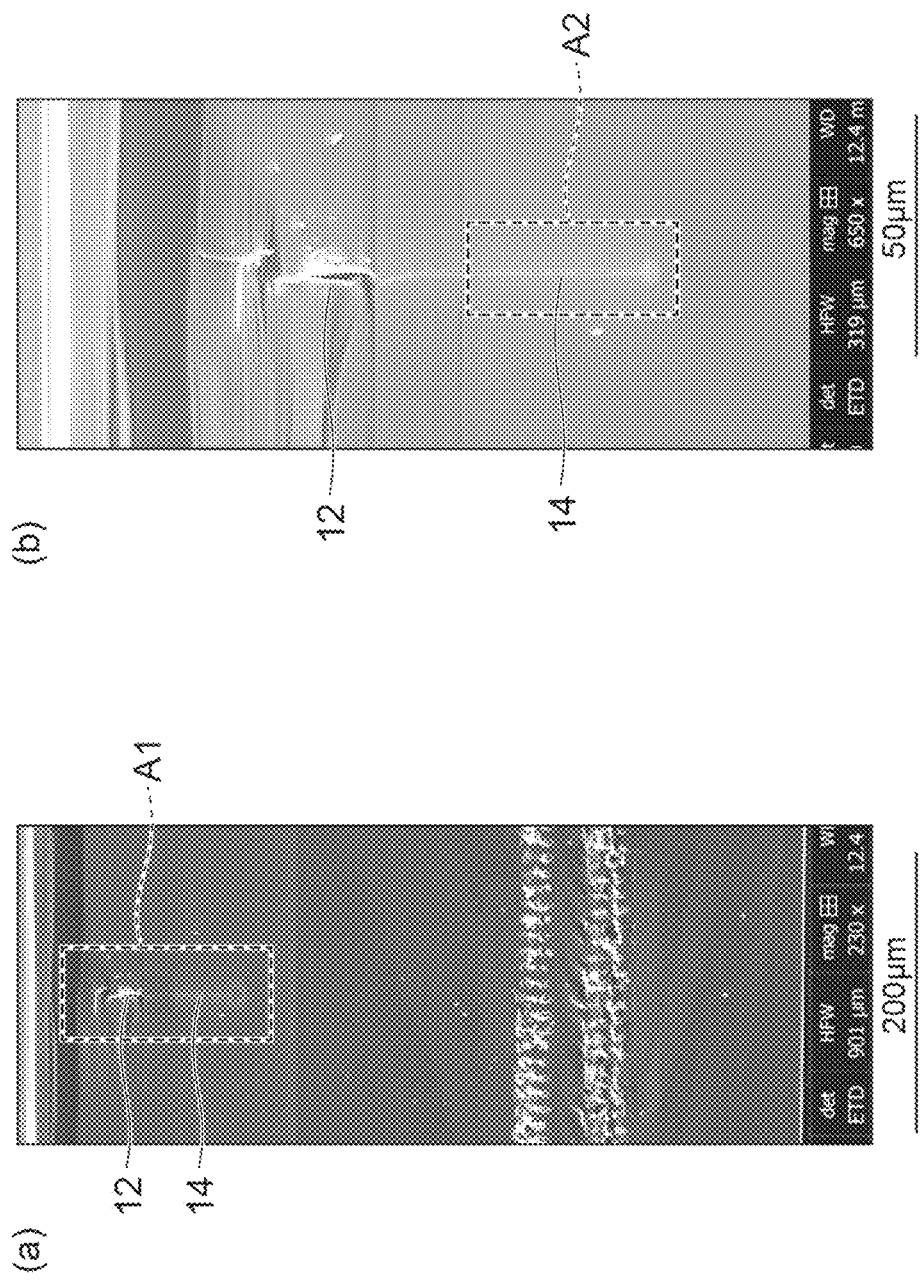
FIG. 9 is an SEM image of a modified region and a crack formed inside a semiconductor substrate.
Figure 10:
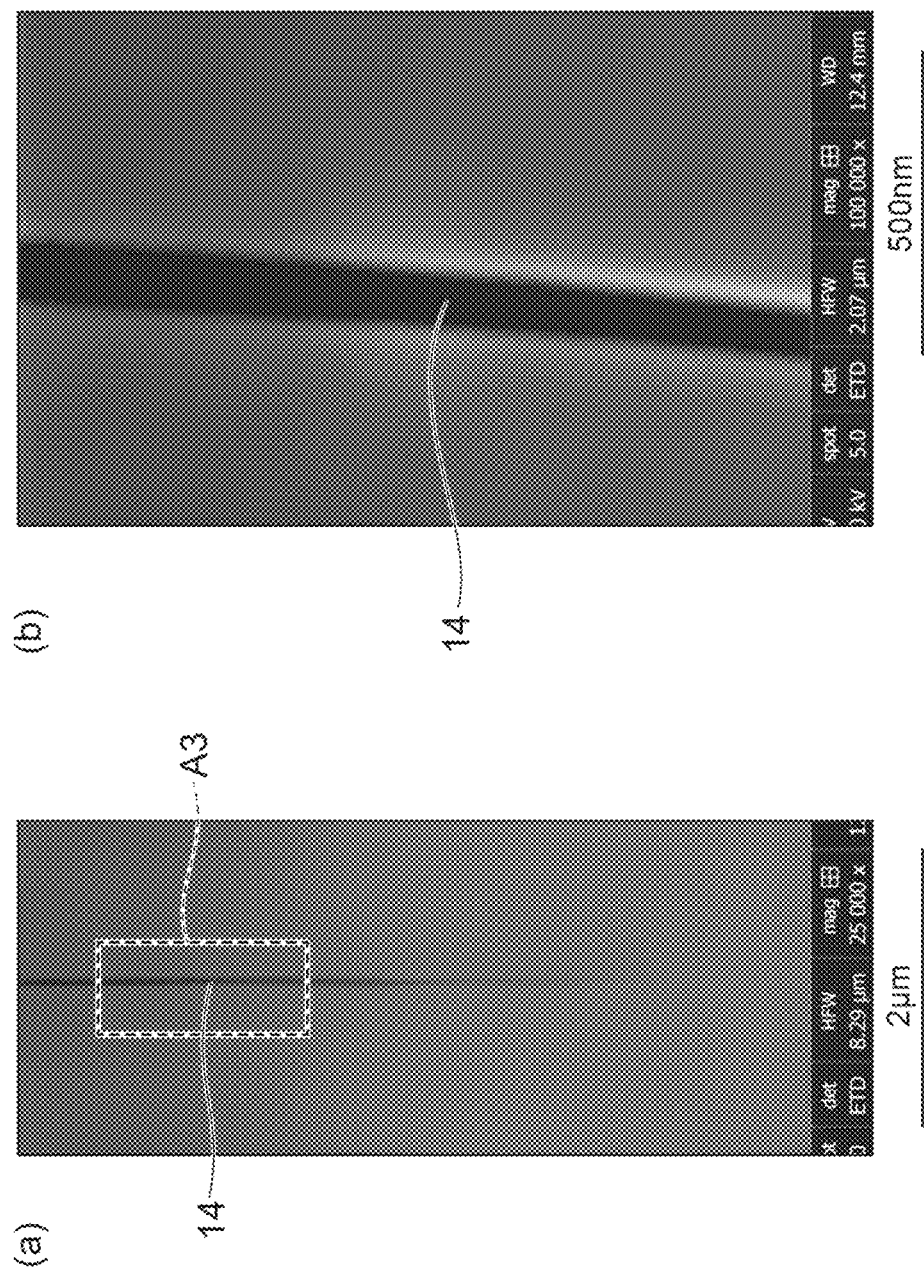
FIG. 10 is another SEM image of a modified region and a crack formed inside a semiconductor substrate.

It is assumed that the crack 14 itself cannot be confirmed as described above because the width of the crack 14 is smaller than the wavelength of the light I1 which is illumination light. FIGS. 9 and 10 are scanning electron microscope (SEM) images of the modified region 12 and the crack 14 formed inside the semiconductor substrate 21 which is a silicon substrate. FIG. 9(b) is an enlarged image of a region A1 illustrated in FIG. 9(a), FIG. 10(a) is an enlarged image of a region A2 illustrated in FIG. 9(b), and FIG. 10(b) is an enlarged image of a region A3 illustrated in FIG. 10(a). In this manner, the width of the crack 14 is approximately 120 nm, which is smaller than the wavelength of the light I1 of a near infrared region (for example, 1.1 to 1.2 µm).

Figure 11:
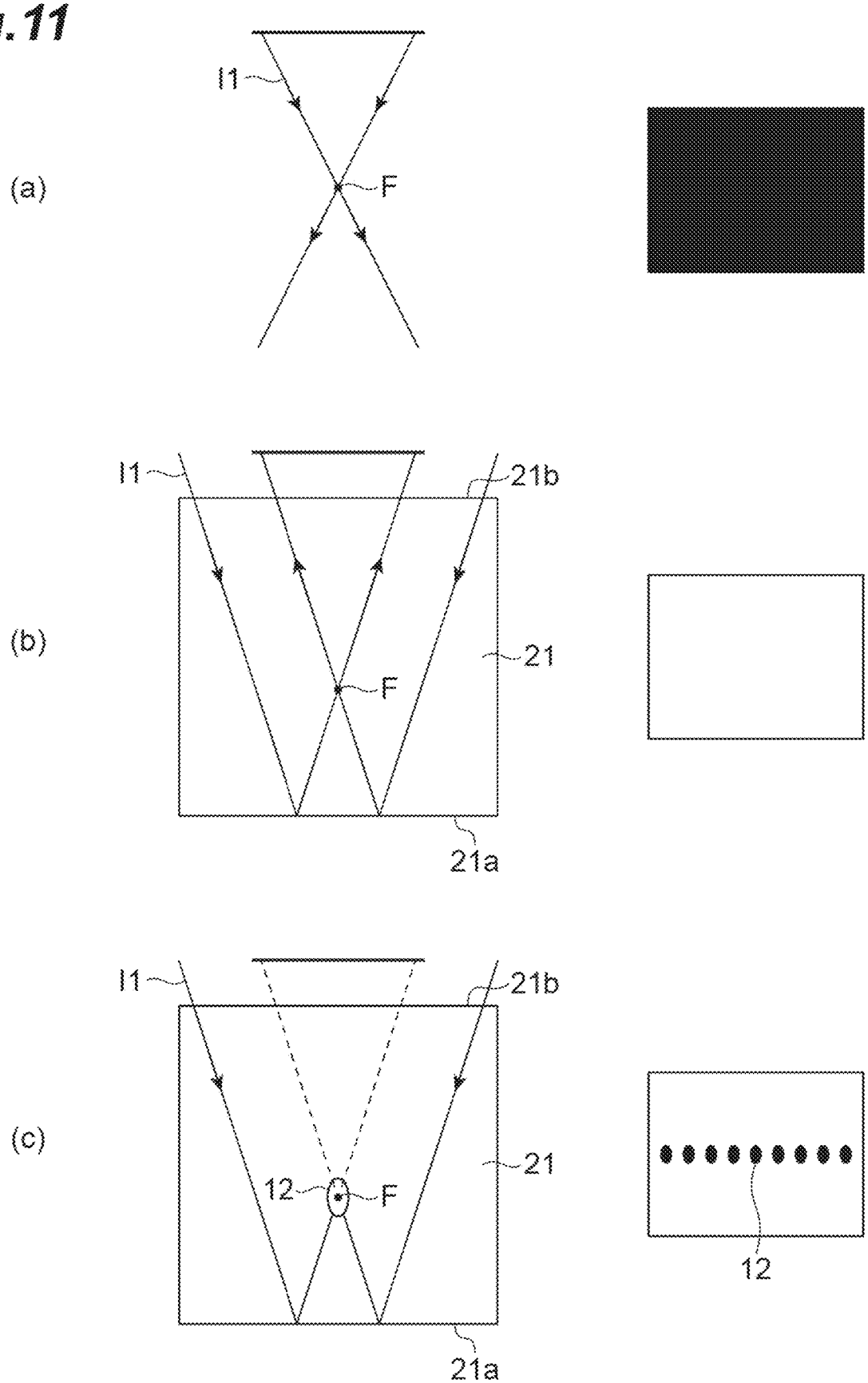
FIG. 11 is a view of optical paths for describing an imaging principle of the inspection imaging unit illustrated in FIG. 5 and is a schematic view illustrating images at focal points taken by the inspection imaging unit.

An imaging principle which is assumed in consideration of the foregoing matters is as follows. As illustrated in FIG. 11(a), when the focal point F is positioned in the air, since the light I1 does not return, a blackish image is obtained (the image on the right side in FIG. 11(a)). As illustrated in FIG. 11(b), when the focal point F is positioned inside the semiconductor substrate 21, since the light I1 reflected by the front surface 21a returns, a whitish image is obtained (the image on the right side in FIG. 11(b)). As illustrated in FIG. 11(c), when the focal point F is focused from the rear surface 21b side on the modified region 12, since absorption, scattering, or the like occurs due to the modified region 12 regarding a part of the light I1 which has been reflected by the front surface 21a and has returned, an image in which the modified region 12 appears to be blackish in a whitish background is obtained (the image on the right side in FIG. 11(c)).

Figure 12:
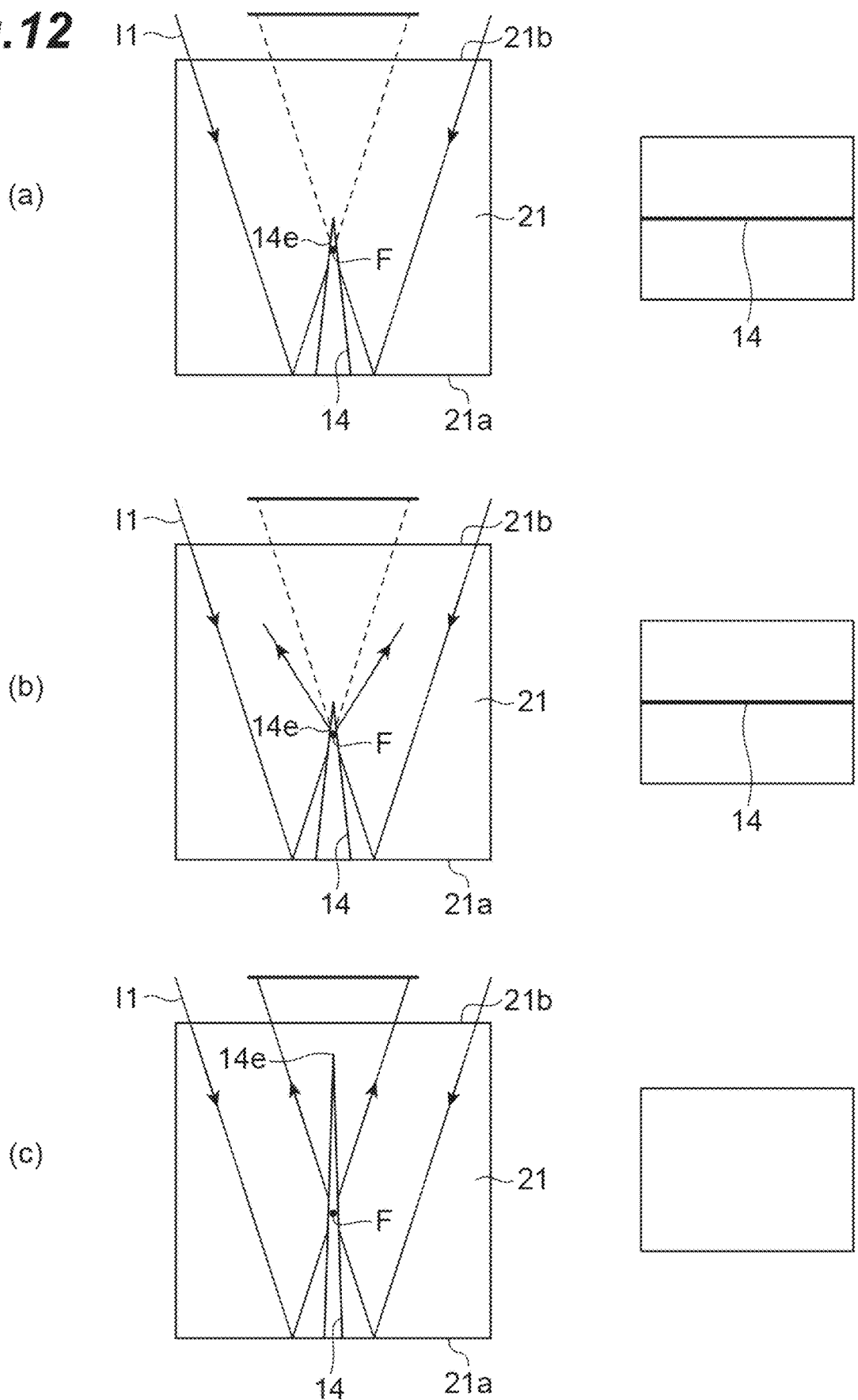
FIG. 12 is another view of optical paths for describing an imaging principle of the inspection imaging unit illustrated in FIG. 5 and is a schematic view illustrating images at focal points taken by the inspection imaging unit.

As illustrated in FIGS. 12(a) and 12(b), when the focal point F is focused from the rear surface 21b side on the tip 14e of the crack 14, for example, since scattering, reflection, interference, absorption, or the like occurs due to optical specificity (stress concentration, distortion, discontinuity of an atomic density, or the like) occurring in the vicinity of the tip 14e, confinement of light occurring in the vicinity of the tip 14e, or the like regarding a part of the light I1 which has been reflected by the front surface 21a and has returned, an image in which the tip 14e appears to be blackish in a whitish background is obtained (the image on the right side in FIGS. 12(a) and 12(b)). As illustrated in FIG. 12(c), when the focal point F is focused from the rear surface 21b side on a part other than the part in the vicinity of the tip 14e of the crack 14, since at least a part of the light I1 reflected by the front surface 21a returns, a whitish image is obtained (the image on the right side in FIG. 12(c)).

[Processing Condition Deriving Treatment]

Hereinafter, processing condition deriving treatment performed as pretreatment of treatment for forming a modified region for the purpose of cutting the wafer 20 or the like will be described. Processing conditions are recipes related to processing indicating conditions and a procedure for processing the wafer 20. The control unit 8 is constituted to execute determining of processing conditions including irradiation conditions of laser light by the laser irradiation unit 3 on the basis of information received by the display 150 (processing condition determining treatment), controlling of the laser irradiation unit 3 such that the wafer 20 is irradiated with laser light under the determined processing conditions (processing treatment), acquiring of a laser processing result of the wafer 20 through irradiation with laser light by controlling the imaging unit 4 so as to image the wafer 20 (processing result acquiring treatment), and evaluating of the processing conditions on the basis of the laser processing result (processing condition evaluating treatment).

(Processing Condition Determining Treatment)

Figure 13:
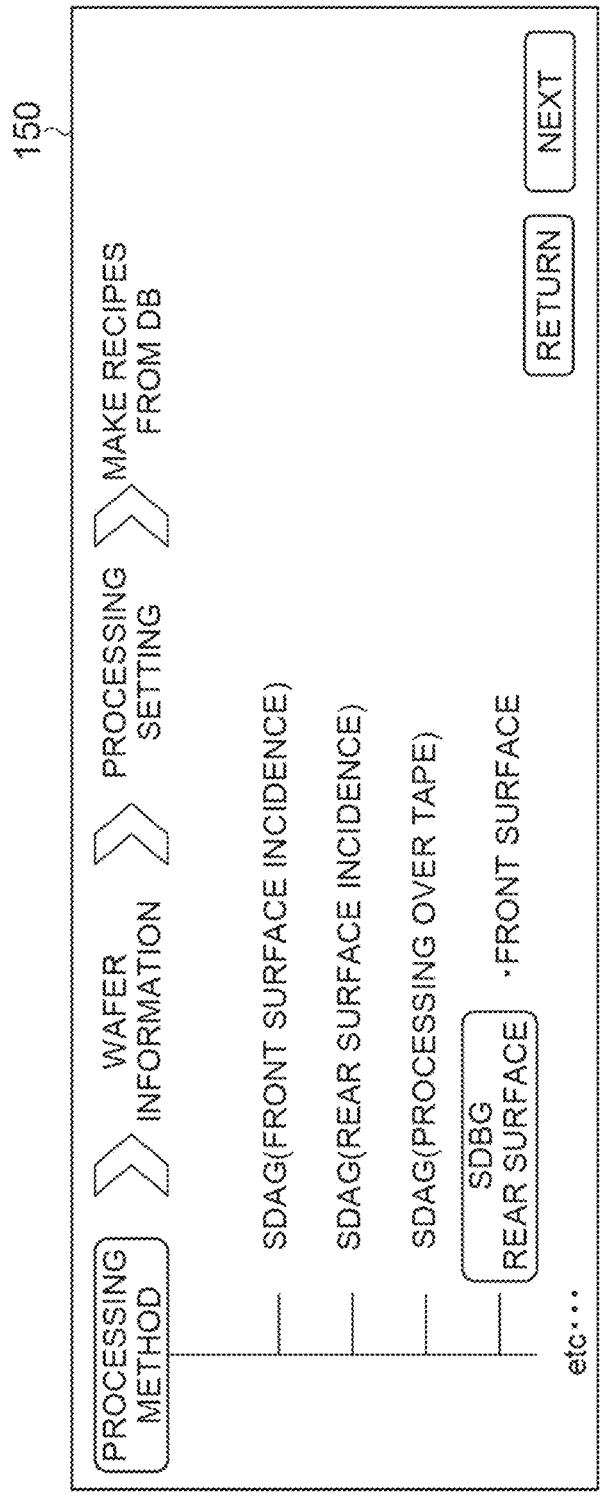
FIG. 13 is an example of a setting screen of wafer processing information.
Figure 14:
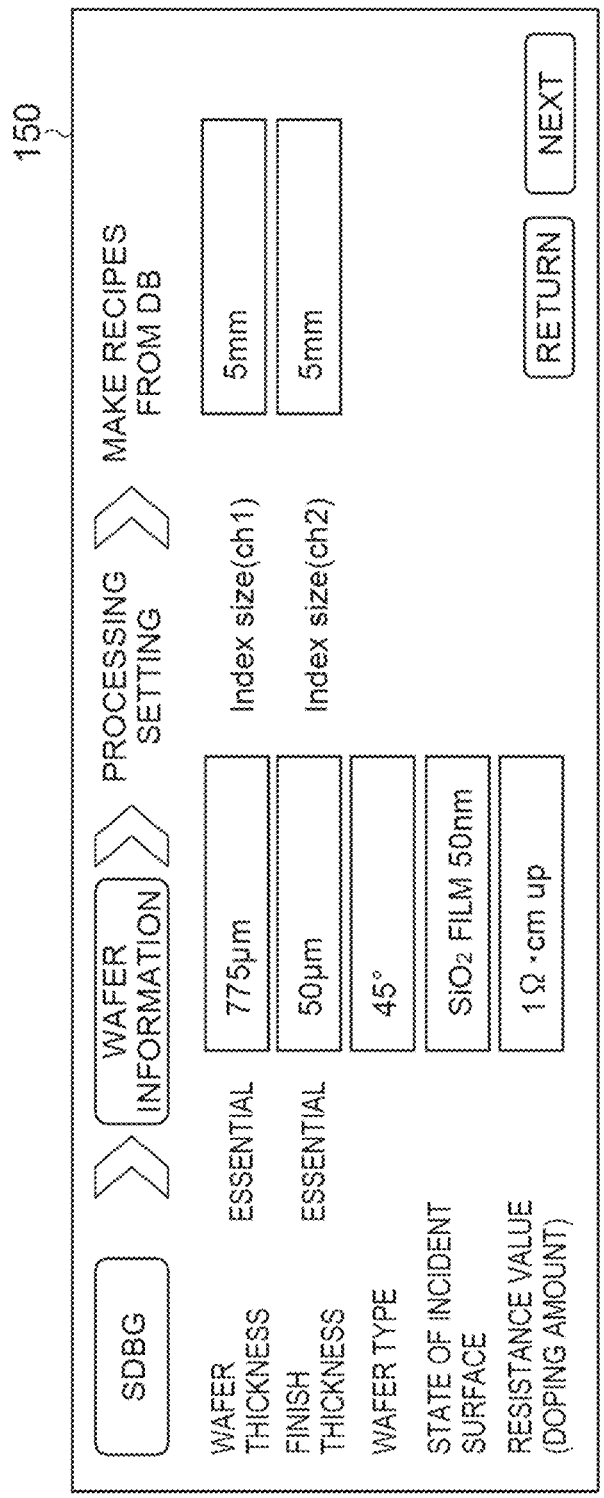
FIG. 14 is another example of a setting screen of wafer processing information.
Figure 15:
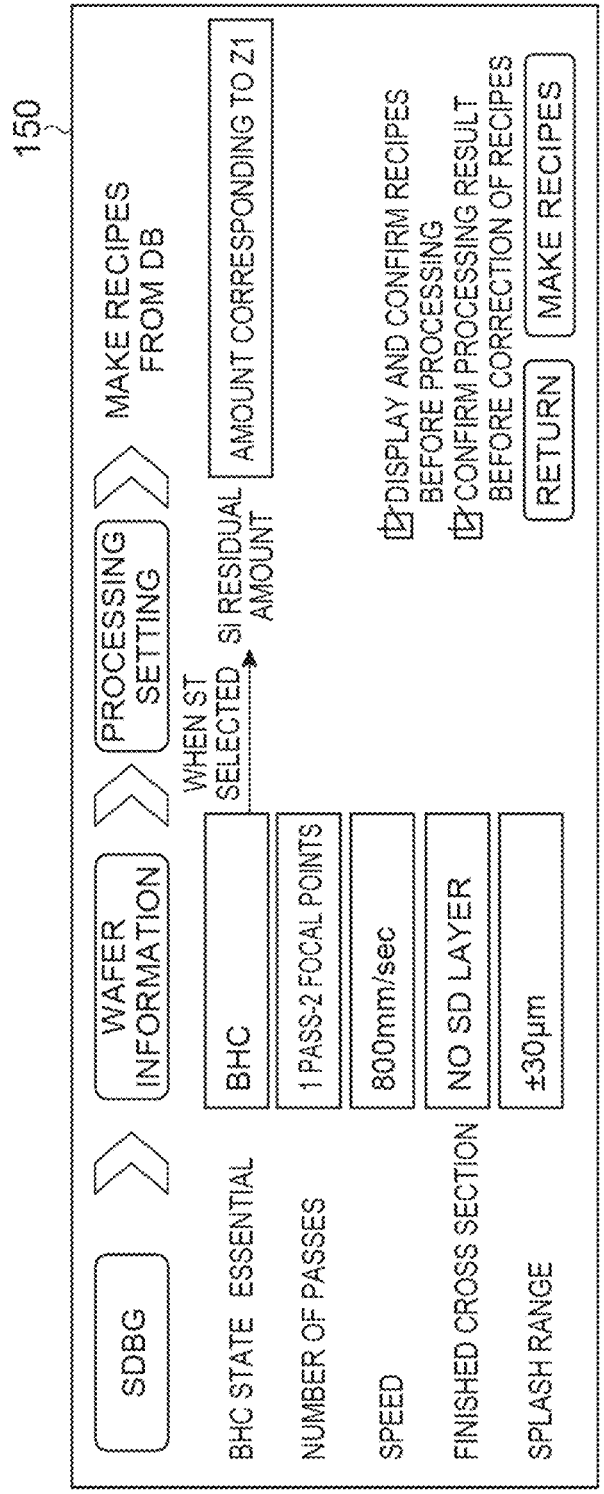
FIG. 15 is another example of a setting screen of wafer processing information.

With reference to FIGS. 13 to 21, the processing condition determining treatment will be described. In the processing condition determining treatment, first, the display 150 receives a user's input for wafer processing information including information of the wafer 20 and a laser processing target with respect to the wafer 20. A laser processing target is information indicating details of laser processing desired by a user. FIGS. 13 to 15 are examples of setting screens for the wafer processing information displayed in the display 150 (user's input reception screen). FIG. 13 is a setting screen for a processing method (information included in the laser processing target described above), FIG. 14 is a setting screen for wafer information (information included in the information of the wafer 20 described above), and FIG. 15 is a setting screen for processing setting (information included in the laser processing target described above). Here, the processing method (FIG. 13), the wafer information (FIG. 14), and the processing setting (FIG. 15) will be described as being set in this order, but a setting order thereof (screen displaying order) is not limited thereto.

As illustrated in FIG. 13, the display 150 first receives a user's input for the processing method. Examples of the processing method broadly include stealth dicing after grinding (SDAG) and stealth dicing before grinding (SDBG). SDAG is a processing method of performing stealth dicing after grinding of the wafer 20. SDBG is a processing method of performing stealth dicing before grinding of the wafer 20. Specifically, for example, the SDAG is divided into three types, such as SDAG (front surface incidence), SDAG (rear surface incidence), and SDAG (processing over a tape). The SDAG (front surface incidence) is a processing method for irradiation with a laser from the front surface 21a side after grinding of the wafer 20 and is a processing method used when there is no TEG on an incident surface such as MEMS and a street width can be ensured. The SDAG (rear surface incidence) is a processing method used when there is TEG on the front surface 21a or when the street width is desired to be reduced. The SDAG (processing over a tape) is used when a tape transfer step is desired to be reduced. Specifically, for example, the SDBG is divided into two types, such as SDBG (front surface incidence) and SDBG (rear surface incidence). Hereinafter, an example in which the SDBG (rear surface incidence) is set as the processing method will be described.

As illustrated in FIG. 14, the display 150 subsequently receives a user's input for the wafer information. Regarding the wafer information, for example, a wafer thickness, a finish thickness, a wafer type, a state of the incident surface, a resistance value (doping amount), an index size (ch1), and an index size (ch2) can be set. Among these, for example, setting of the wafer thickness and the finish thickness may be essential. The wafer thickness is information indicating the thickness of the wafer 20. For example, the wafer thickness is a thickness including both the semiconductor substrate 21 (silicon) and the functional element layer 22 (pattern) of the wafer 20. The wafer thickness may be set in a manner of being divided into a silicon wafer thickness and a pattern thickness. For example, the finish thickness is information indicating the thickness of the wafer 20 after grinding. That is, grinding is performed using a grinder until the finish thickness is obtained. After grinding is performed using a grinder, the tape transfer step and an expanding step are performed. When a stealth dicing device and a grinding device (grinder) can communicate with each other, information of the finish thickness may be shared between both the devices. For example, the finish thickness is a thickness including both the semiconductor substrate 21 (silicon) and the functional element layer 22 (pattern) of the wafer 20. The finish thickness may be set in a manner of being divided into the silicon wafer thickness and the pattern thickness. For example, information of the pattern thickness, information of a laminate structure, and the like are used when the control unit 8 estimates a length of the crack 14. In place of the finish thickness, a grinding amount may be set.

For example, the wafer type is a type such as a "00" product, a "45°" product, or the like corresponding to a position of a notch. For example, when 45° is set as the wafer type, BHC is recommended in a BHC state of the processing setting which will be described below. "Bottom side half-cut (BHC)" is a term indicating a state where the crack 14 has arrived at the front surface 21a (that is, a crack arrival state). In order to realize the BHC, the crack 14 need only arrive at the front surface 21a, and it does not matter whether or not the crack 14 has arrived at a pattern surface (the front surface of the functional element layer 22). When 0° is set as the wafer type, both ST and BHC are recommended in the BHC state of the processing setting which will be described below. "Stealth (ST)" is a term indicating a state where the crack 14 has not arrived at the rear surface 21b and the front surface 21a. The state of the incident surface is information indicating a film type (refractive index), a film thickness, or the like of the incident surface. A reflectance is calculated and an output of laser light is determined by the control unit 8 on the basis of the state of the incident surface, the laser wavelength, or the like. The resistance value (doping amount) is a value of a resistance (in the case of the doping amount, a value of the doping amount converted into a value of the resistance). An arrival rate is calculated and an output of laser light is determined by the control unit 8 on the basis of the resistance value, the laser wavelength, or the like. The index size is information utilized for determining or the like of an index value of a dicer. When an unknown wafer 20 is processed, since the wafer type, the state of the incident surface, the resistance value, and the like are uncertain, they may not be set.

As illustrated in FIG. 15, the display 150 subsequently receives a user's input for the processing setting. Some of various kinds of information for the processing setting may be automatically set on the basis of the processing method and the wafer information described above. Regarding the processing setting, for example, a BHC state (crack arrival information), a Si residual amount (information indicating an assumed extending amount of a crack), the number of passes, a speed, a finished cross section, and a splash range can be set. Among these, for example, setting of the BHC state may be essential. The BHC state is information indicating either one of BHC or ST. That is, the BHC state is crack arrival information indicating whether to set to a state where a crack extending from a modified region formed when the wafer 20 is irradiated with laser light has arrived at the front surface 21a of the wafer or a state where it has not arrived. When the ST is set for the BHC state, the Si residual amount described above can be set. The Si residual amount is a length from an arrival position of the crack 14 to the front surface 21a after ST processing (a length of a silicon part remaining after ST processing). When the ST processing has been performed, in order to ultimately divide the wafer 20, there is a need to extend the crack 14 at the time of grinding to be in the BHC state before the expanding step. Generally, a user performs operation while a degree of extension of the crack 14 through grinding is ascertained. For example, it is conceivable that an extending amount of the crack 14 in a grinder is ascertained based on the number of stages of a Z height indicating a processing depth (height) when the laser processing is performed. That is, it is conceivable that a user ascertains an assumed extending amount of the crack 14 in a grinder based on the number of stages of a Z height, such as "an amount corresponding to Z1" (an amount corresponding to the depth of one stage of the Z height) and "an amount corresponding to Z2" (an amount corresponding to the depth of two stages of the Z height), for example. Therefore, at the time of the ST processing, the wafer 20 can be reliably divided while the ST processing is performed and an advantage of the ST processing (increase in the processing speed or reduction of splashes) is achieved by setting an assumed extending amount (the number of stages of the Z height) of the crack 14 in the grinder as the Si residual amount. When the Z height is set at the time of the laser processing, it is shifted from a position of the BHC in an ST direction (a direction in which the crack 14 becomes short) as much as the Z height set for the Si residual amount. In a database (a database in which the wafer processing information and the processing conditions (recipes) are stored in association with each other) which will be described below, recipes including the Si residual amount may be stored. For example, the Si residual amount may be calculated from the wafer thickness and the Z height by measuring the amount of crack in the ST state.

The number of passes is information indicating the number of passes and the number of focal points. A value desired by a user is set as the number of passes. In a case where processing is not able to be performed with the set number of passes, the control unit 8 may increase the number of passes when the processing conditions (recipes) are proposed to a user or when the processing conditions (recipes) are corrected. When various kinds of wafer processing information received by the display 150 are not appropriate, the control unit 8 may control the display 150 so as to display a message prompting revision. The speed is a laser processing speed. The control unit 8 determines a laser output, a frequency, and a pulse pitch in consideration of the set speed. In a case where processing is not able to be performed at the set speed, the control unit 8 may change the speed when the processing conditions (recipes) are proposed to a user or when the processing conditions (recipes) are corrected. The splash range is information indicating a width of a splash. When the splash range is narrow, the control unit 8 may determine a Z height or a pulse pitch to be in the ST state or may determine processing conditions in which a black streak is generated.

The finished cross section is information indicating whether or not to be in a state where a modified region (stealth dicing (SD) layer) formed when the wafer 20 is irradiated with laser light appears in a chip cross section (a finished cross section of the wafer 20) after the laser processing and the finishing (grinding) processing are completed. In the SDBG, since grinding is performed after the laser processing, depending on the conditions, finishing can be performed such that no SD layer remains in the chip cross section. Since no SD layer remains in the chip cross section, the strength of a chip can be improved and particles can be reduced. The conditions in which "no SD layer" can be set for the finished cross section will be described with reference to FIG. 16. In FIGS. 16(*a*) to 16(*d*), SD1 indicates a modified region. At present, it is assumed that "no SD layer" is set for the finished cross section of the display 150 in the processing setting. In this case, as illustrated in FIG. 16(*a*), the control unit 8 determines the processing conditions such that SD1 is set so as to make the length from the lower end of SD1 to the front surface 21*a* (SD1 lower end distance) longer than the finish thickness set in the wafer information. At present, when the crack length is longer than the SD1 lower end distance in the case of the BHC state as illustrated in the left diagram of FIG. 16(*b*), or when the sum of the crack length and the Si residual amount is longer than the SD1 lower end distance in the case of the ST state as illustrated in the right diagram of FIG. 16(*b*), the control unit 8 judges that "no SD layer" can be set for the finished cross section. On the other hand, as illustrated in FIG. 16(*c*), for example, when the sum of the crack length and the Si residual amount is shorter than the SD1 lower end distance in the case of the ST state, the control unit 8 judges that "no SD layer" cannot be set for the finished cross section. In this case, the control unit 8 may switch the finished cross section to "with an SD layer". Alternatively, the finished cross section may be switched to "with an SD layer" upon judgment of a user.

As illustrated in FIG. 15, in an input screen for the processing setting, it is possible to select whether or not to perform two categories of "display and confirm the recipes before processing" and "confirm the processing result before correction of the recipes". Recipes are information indicating processing conditions. When "display and confirm the recipes before processing" is selected, if the recipes (processing conditions) are determined by the control unit 8, the recipes are displayed before the laser processing is performed. When "display and confirm the recipes before processing" is not selected, if the recipes (processing conditions) are determined by the control unit 8, the laser processing is started without displaying the recipes. When "confirm the processing result before correction of the recipes" is selected, an actual processing result is displayed before correction of the recipes (or settlement of the recipes). When "confirm the processing result before correction of the recipes" is not selected, if the processing is completed, correction of the recipes (or settlement of the recipes) is performed without displaying an actual processing result. When "make the recipes" illustrated in FIG. 15 is pressed down, recipe determining treatment is executed by the control unit 8.

Figure 17:
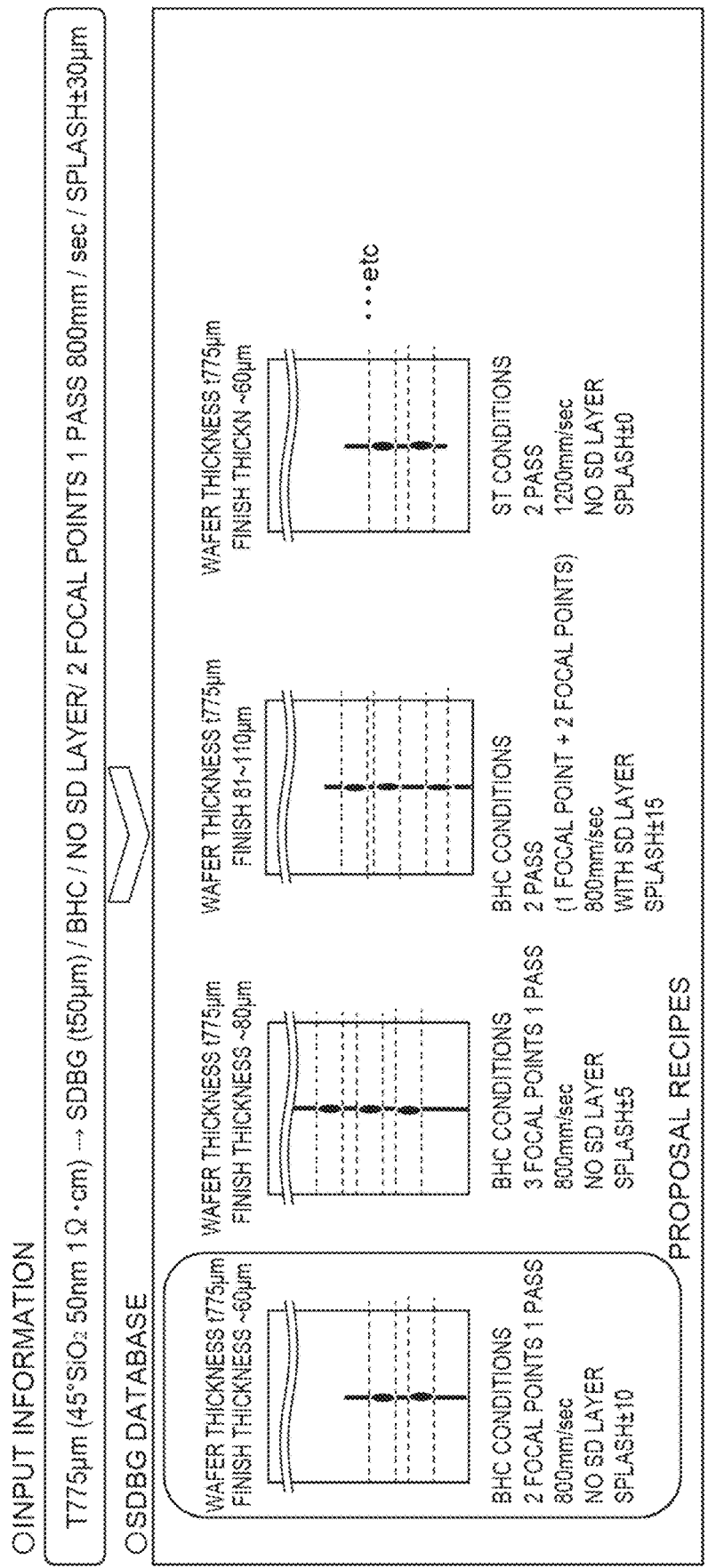
FIG. 17 is an explanatory view of selection of a recipe from a database.
Figure 18:
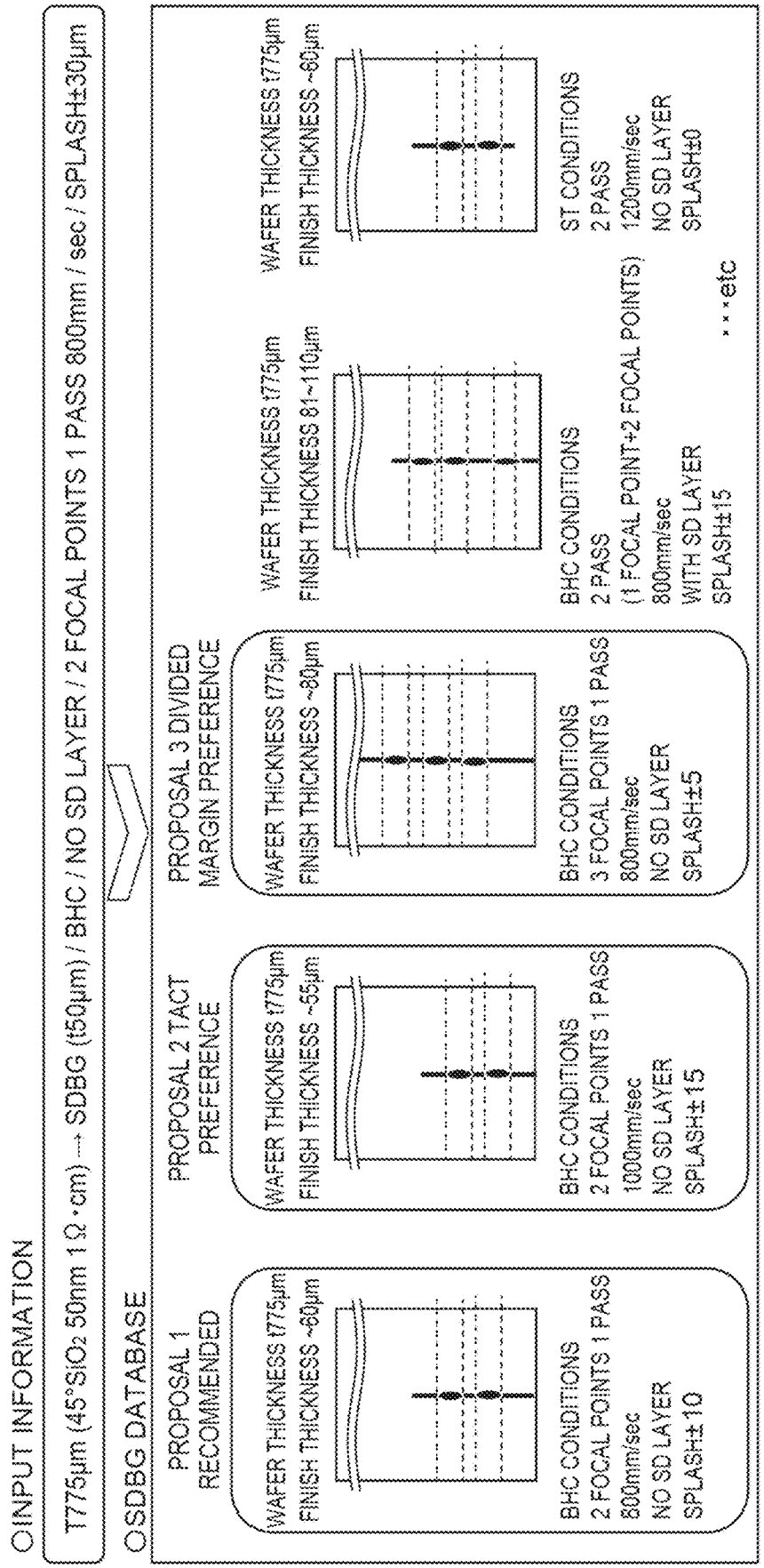
FIG. 18 is an explanatory view of selection of a plurality of recipes from the database.

The control unit 8 determines the recipes (processing conditions) including the irradiation conditions of laser light by the laser irradiation unit 3 on the basis of the wafer processing information (various kinds of information received through the setting screens in FIGS. 13 to 15) received by the display 150. The control unit 8 determines the recipes (processing conditions) corresponding to the wafer processing information received by the display 150 by referring to the database in which the wafer processing information and the recipes (processing conditions) are stored in association with each other. More specifically, the control unit 8 may determine the recipes corresponding to the wafer processing information received by the display 150 using a computer program based on an algorithm generated from the database, or a feedback control program referring to the database. The database may be provided in the inspection device 1 or may be provided in an external device (web server) which can communicate with the inspection device 1. For example, depending on an installation place of the inspection device 1, the inspection device 1 may not be able to be connected to a network. Even in such a case, the control unit 8 can execute a function related to the database by installing a database such as a native application in an electronic medium (a DVD, a CD, a USB memory, an SD card, or the like) in the inspection device 1. In such a constitution, although it is not possible to be connected to a database subjected to central management in a web server, feedback information of only a particular user can be collected, the database can be continuously updated, and the accuracy of inspection can be enhanced intensively and continuously by individually managing the database inside the inspection device 1. In addition, when a database is present in the web server, the database is likely to be subjected to central management, and thus an inspection function utilizing a database (user DB) will be able to be widely provided through opening of a web application or a web API or distribution of a native application. Further, the accuracy of inspection can be enhanced comprehensively and continuously by collecting feedback information from many users and continuously updating the database. FIG. 17 is an explanatory view of recipes selected from a database. FIG. 17 is merely a schematic view for describing determination of processing conditions (recipes) using a database and does not illustrate information which is actually stored in a database. For example, in FIG. 17, an estimated processing result image related to each of the recipes (which will be described below) is illustrated, but images may not be actually stored in the database. The recipes include a wavelength of laser light which is irradiation conditions (laser conditions) of laser light, a pulse width, a frequency, a speed, the number of focal points which is information related to processing point setting and LBA setting, a correction level such as a spherical aberration or an astigmatism related to a light concentration state of the processing points, the Z height when a modified region is formed, and the like.

As illustrated in FIG. 17, the database stores the recipes (processing conditions) corresponding to each piece of the wafer processing information. The control unit 8 performs matching with respect to the wafer processing information (input information) received by the display 150 and selects the recipes corresponding to the wafer processing information closest to the input information in the wafer processing information loaded in the database as proposal recipes. Matching treatment may be executed utilizing artificial intelligence (AI). At present, as illustrated in FIG. 17, it is assumed that "wafer thickness: 775 μm", "finish thickness: 50 μm", "wafer type: 45°", "state of incident surface: SiO2 film of 50 nm", "resistance value (doping amount): 1 Ω/cm", "processing method: SDBG (rear surface)", "BHC state: BHC", "number of passes: 2 focal points and 1 pass", "speed: 800 mm/sec", "finished cross section: no SD layer", and "splash range: splash±30 μm" are input as the input information. In this case, with reference to the database, regarding the wafer processing information, the control unit 8 selects the recipes (the recipes on the left end side) in which "wafer thickness of t775 μm", "finish thickness to 60 μm", "BHC conditions", "2 focal points and 1 pass", "800 mm/sec", "no SD layer", and "splash±10" are set as the proposal recipes.

When there is a difference (there is a deviated parameter) between the wafer processing information of the proposal recipes selected by performing the matching treatment described above and the wafer processing information of the input information, the control unit 8 may correct the parameter deviation by calculation and simulation and may determine the recipes having a corrected parameter as the proposal recipes. For example, when the wafer thicknesses differ from each other, the control unit 8 may correct the Z height in accordance with the difference between the wafer thicknesses, may correct an output of laser light in accordance with the difference between the resistance values when the resistance values differ from each other, may correct the frequency of laser light in accordance with the difference between the speeds when the speeds differ from each other, and may correct the number of focal points in accordance with the difference between the numbers of passes when the numbers of passes differ from each other.

With reference to the database, the control unit 8 may extract a plurality of recipe candidates which are candidates of the processing conditions (recipes) corresponding to the wafer processing information received an input and may control the display 150 so as to display the plurality of recipe candidates. In the example illustrated in FIG. 18, the control unit 8 has extracted three recipe candidates. At present, the input information is similar to that of the example in FIG. 17 described above. Further, most recommended recipes (recipes described as "Proposal 1 recommended" in FIG. 18), tact preference recipes (recipes described as "Proposal 2 tact preference" in FIG. 18), divided margin preference recipes (recipes described as "Proposal 3 divided margin preference" in FIG. 18) have been extracted. For example, the most recommended recipes are recipes having the highest matching degree with respect to the input information (matching degree of the wafer processing information). For example, the tact preference recipes are recipes having a relatively high matching degree with respect to the input information (matching degree of the wafer processing information) and a high speed. The tact preference recipes in FIG. 18 have a speed of 1,000 mm/sec which is higher than the speeds of other recipes. For example, the divided margin preference recipes are recipes having a relatively high matching degree with respect to the input information (matching degree of the wafer processing information) and a large number of focal points. The divided margin preference recipes in FIG. 18 have three focal points as the number of focal points which is more than the numbers of focal points of other recipes. In this manner, since a plurality of recipe candidates are extracted and displayed in the display 150, a user can select desired recipes. The control unit 8 may extract a plurality of recipe candidates to be extracted from a viewpoint other than recommended, tact preference, and divided margin preference described above. For example, they may be extracted from a viewpoint of quality preference (curbing meandering or particles).

The control unit 8 may control the display 150 so as to display a plurality of recipe candidates in a display form in consideration of the matching degree by deriving the matching degree with respect to the wafer processing information (input information) individually received an input for the plurality of recipe candidates. Specifically, for example, the control unit 8 may control the display 150 so as to display the matching degrees of a plurality of recipe candidates or so as to display the recipe candidates having a higher matching degree and the recipe candidates having a lower matching degree in a distinguished manner. In addition, the control unit 8 may control the display 150 so as to display a recommendation order corresponding to the matching degrees of the plurality of recipe candidates. In addition, the control unit 8 may control the display 150 so as to display various kinds of information (recipe features) which will become information for judging when a user selects recipes from a plurality of recipe candidates.

The display 150 receives a user's input for selecting one recipe candidate in a state where a plurality of recipe candidates are displayed. Further, the control unit 8 may determine the recipe candidate selected through a user's input received by the display 150 as the recipes (processing conditions).

Figure 19:
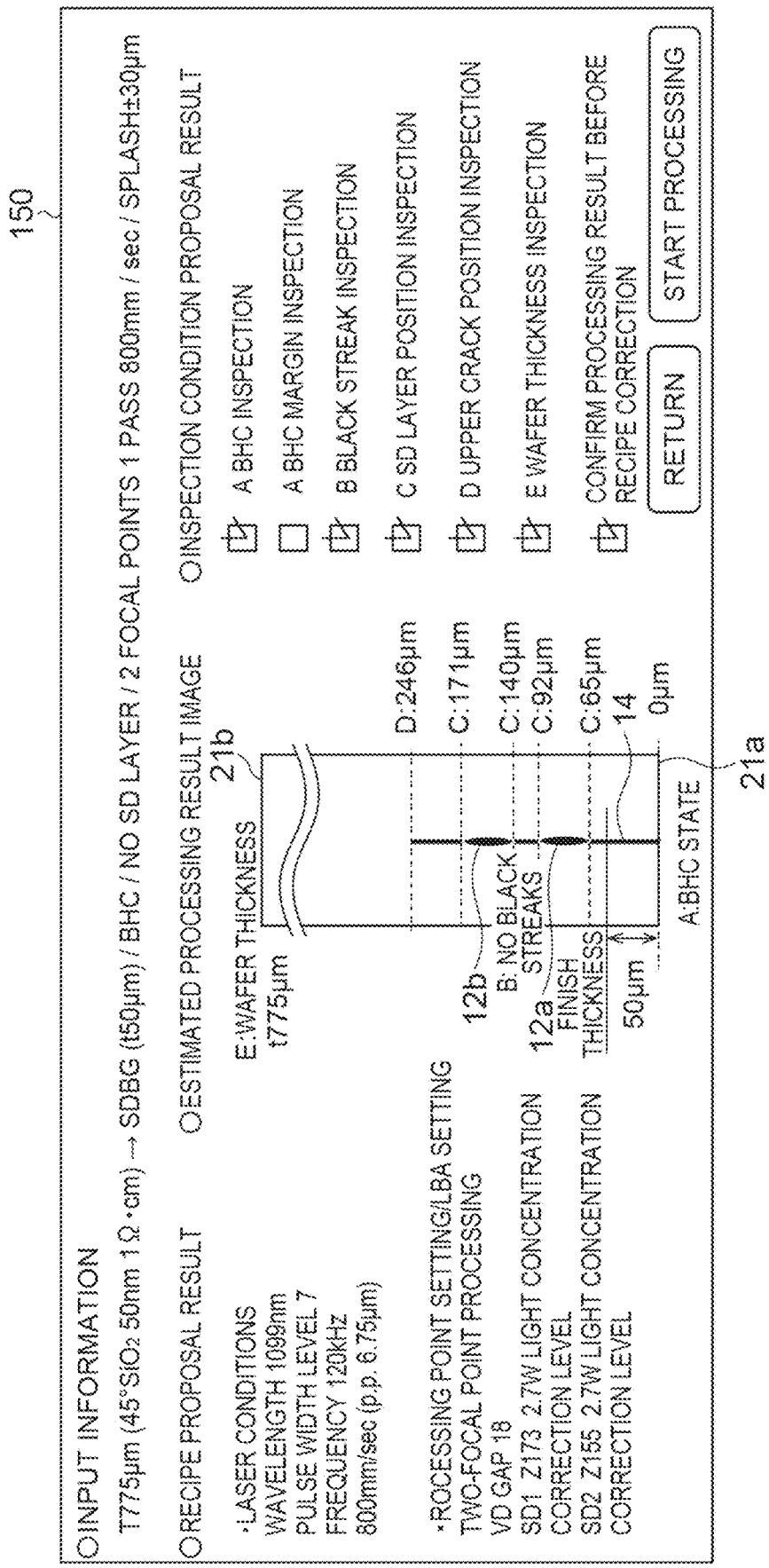
FIG. 19 is an example of a display screen of an estimated processing result image.

The control unit 8 may further execute controlling of the display 150 so as to display the determined recipes (processing conditions). FIG. 19 is an example of a display screen of the estimated processing result image (which will be described below). As illustrated in FIG. 19, when the proposal recipes are determined, the display 150 displays the details of the proposal recipes together with the wafer processing information (input information) and the estimated processing result image (which will be described below) which have been received. The details of the proposal recipes to be displayed may be a part of information included in the determined recipes (processing conditions). That is, recipes may have a parameter retained inside without being displayed for a user. In the example illustrated in FIG. 19, regarding the details of the proposal recipes, the wavelength (Level 9) which is irradiation conditions (laser conditions) of laser light, the pulse width (Level 7), the frequency (Level 12), the speed (800 mm/sec), the number of focal points which is information related to processing point setting and LBA setting (two-focal point processing), the Z heights (Z173 and Z155) related to formation of the modified regions SD1 and SD2 in two rows, and the like are displayed.

The control unit 8 may derive an estimated processing result when the wafer 20 is irradiated with laser light by the laser irradiation unit 3 on the basis of the determined recipes (processing conditions) and may control the display 150 so as to display the estimated processing result image which is an image of the estimated processing result. More specifically, the control unit 8 is constituted to execute deriving of an estimated processing result including information of a modified region and a crack extending from the modified region formed on the wafer 20 when the wafer 20 is irradiated with laser light by the laser irradiation unit 3 on the basis of the set recipes, and controlling of the display 150 so as to display an estimated processing result image depicting both a graphic image of the wafer 20 and a graphic image of the modified region and the crack in the wafer 20 in consideration of positions of the modified region and the crack in the wafer 20 derived as the estimated processing result. More specifically, an estimated processing result is a position of a modified region, an extending amount of a crack extending from the modified region, the presence or absence of a black streak, or the like estimated on the basis of the received wafer processing information (input information) and the determined recipes. The control unit 8 controls the display 150 so as to display both the recipes (processing conditions) and the estimated processing result image associated with each other.

As illustrated in FIG. 19, the estimated processing result image is displayed in the display 150 together with the received wafer processing information (input information) and the recipes. In the example illustrated in FIG. 19, the modified regions 12a and 12b in two rows are depicted in the display 150, and the crack 14 across the modified regions 12a and 12b in two rows is depicted. The positions of the modified regions 12a and 12b and the crack 14 which have been depicted are derived on the basis of the recipes by the control unit 8. At present, the estimated processing result image of the display 150 shows A: BHC state (being in a state of BHC), B: no black streak (no black streak is generated), C: 65 μm, 92 μm, 140 μm, and 171 μm (the lower end target position of the modified region 12a is 65 μm, the upper end target position of the modified region 12a is 92 μm, the lower end target position of the modified region 12b is 140 μm, and the upper end target position of the modified region 12b is 171 μm based on the front surface 21a), D: 246 μm (the upper end target position of the crack 14 extending from the modified region 12b toward the rear surface 21b is 246 μm based on the front surface 21a), E: wafer thickness t775 μm (the wafer thickness is 775 μm), the finish thickness is 50 μm, and the like. Each of the target values for the target position and the like may be indicated in a range instead of a value of one point.

The display 150 may receive an input of first corrected information related to correction of positions of the modified regions 12a and 12b and the crack 14 displayed as the estimated processing result image in a state where the estimated processing result image is displayed. That is, the display 150 may receive an input of the first corrected information which is information for correcting the target positions of the modified regions 12a and 12b and the target position of the crack 14. In this case, the control unit 8 may correct the estimated processing result on the basis of the first corrected information (that is, information for correcting the target positions of the modified regions 12a and 12b and the target position of the crack 14), may correct various parameters of the recipes so as to obtain the estimated processing result after correction, and may control the display 150 so as to display both the recipes after correction and the estimated processing result image based on the estimated processing result after correction associated with each other.

The display 150 may receive an input of second corrected information related to correction of recipes in a state where the processing conditions (recipes) are displayed. In this case, the control unit 8 may correct various parameters of the recipes on the basis of the second corrected information, may correct the estimated processing result on the basis of the recipes after correction, and may control the display 150 so as to display both the recipes after correction and the estimated processing result image based on the estimated processing result after correction associated with each other.

The control unit 8 may control the display 150 so as to display an inspection condition proposal result (refer to FIG. 19) together with the estimated processing result image. The inspection condition proposal result shows recommended inspection conditions on the basis of the recipes and the estimated processing result image. The processes of inspection with alphabets A to E shown in the inspection condition proposal result of FIG. 19 are processes of inspection corresponding to the details of A to E in the estimated processing result image described above. That is, in the inspection condition proposal result of FIG. 19, A: BHC inspection and A: BHC margin inspection are recommended as the inspection for A: BHC state, B: black streak inspection is recommended as the inspection for B: black streak, C: SD layer position inspection is recommended as the inspection for C: position of the modified region (SD layer), D: upper crack position inspection is recommended as the inspection for D: upper end position of the crack 14, and E: wafer thickness inspection is recommended as the inspection for E: wafer thickness. In the BHC margin inspection, the rear surface state (ST or BHC), the position of the tip of the upper crack, the change amount of the position of the tip of the upper crack, the length of the lower end crack, and the like in each of the Z heights are shown. Further, as illustrated in FIG. 19, a user can select whether or not to execute each process of the inspection shown in the inspection condition proposal result. When "processing start" illustrated in FIG. 19 is pressed down after the inspection to be executed is selected, the processing treatment is started, and each process of selected inspection is executed after the processing treatment is completed.

Figure 20:
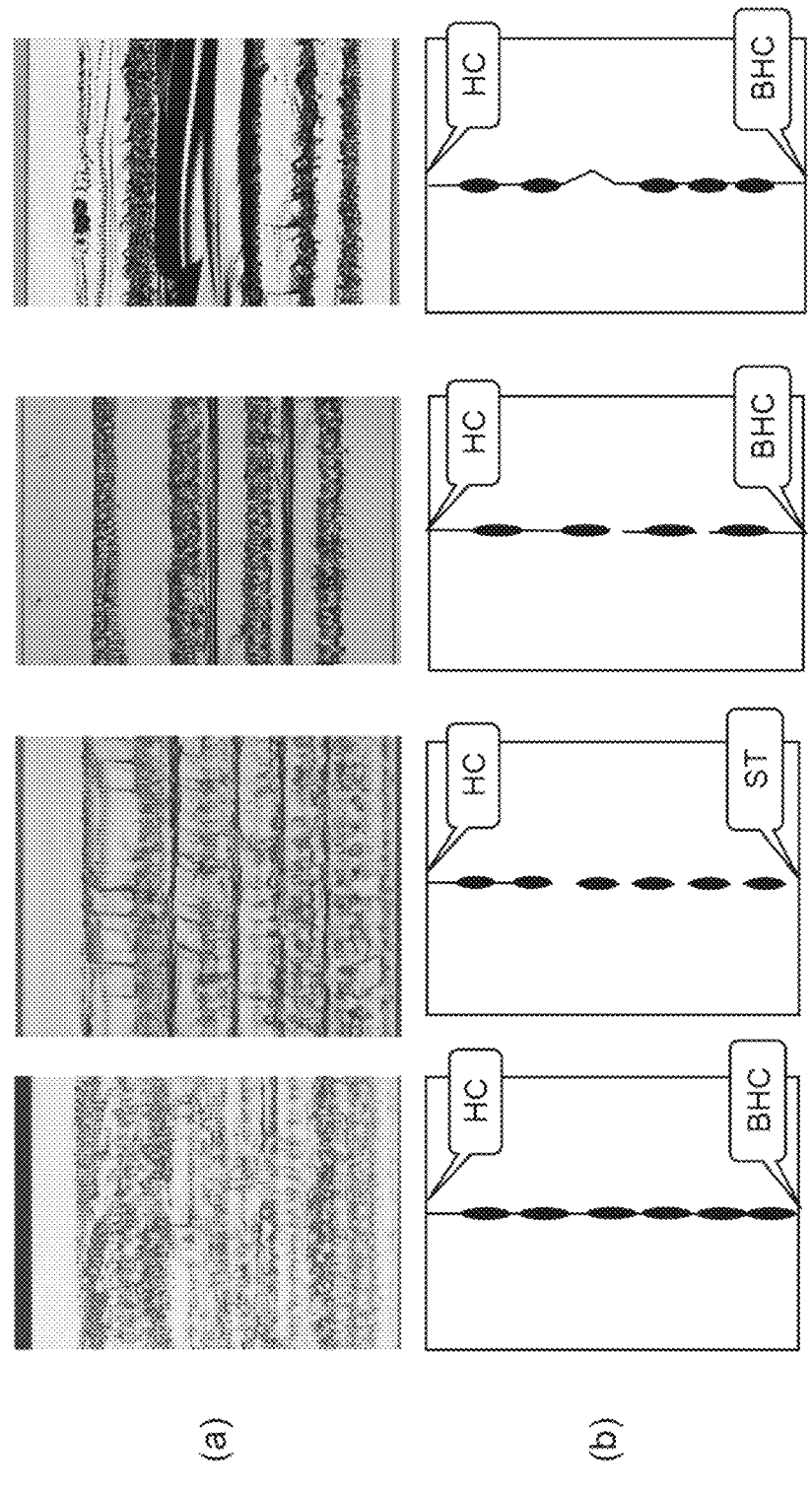
FIG. 20 is an explanatory view of an estimated processing result image.
Figure 21:
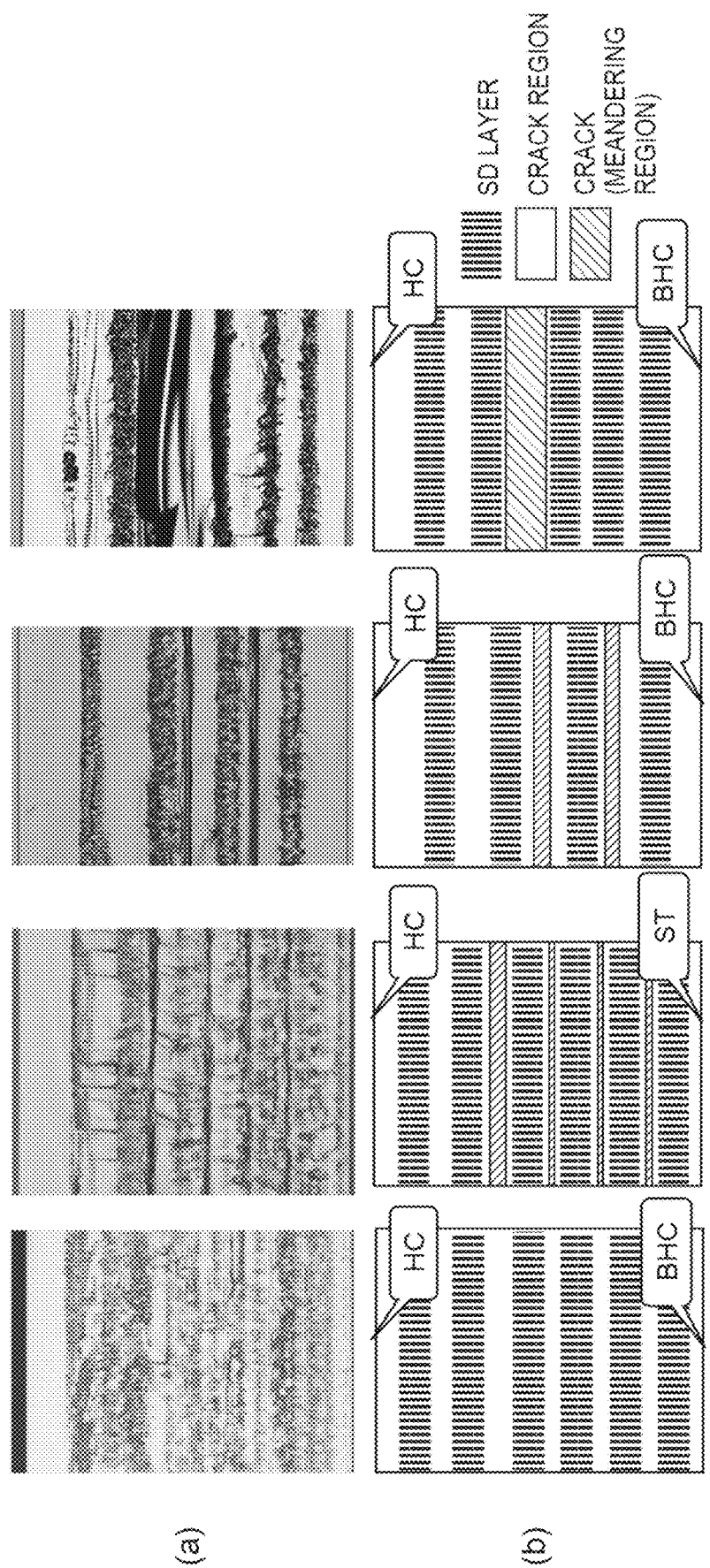
FIG. 21 is another explanatory view of an estimated processing result image.

Displaying of the estimated processing result image described above will be described in more detail with reference to FIGS. 20 and 21. Here, an example of a way of being schematically illustrated with respect to an actual cross-sectional state in an estimated processing result image will be described. FIG. 20(a) illustrates actual states of diverse cross sections, and FIG. 20(b) illustrates estimated processing result images of a cross section perpendicular to a processing line when the cross section illustrated in FIG. 20(a) is obtained. FIGS. 20(a) and 20(b) illustrate states which are vertically corresponding to each other. As illustrated in FIG. 20(b), in the estimated processing result image of a cross section perpendicular to the processing line, the modified region (SD layer) is displayed in an oval shape (or a circle) and the crack is displayed in a line, and connection of a crack across the modified region is schematically illustrated. According to such an estimated processing result image, it is possible to visually express that it is in the BHC state (left end in FIG. 20(b)), it is in the ST state and the crack is disconnected in the middle (the second from the left in FIG. 20(b)), it is in the BHC state and the crack is disconnected in the middle (the second from the right in FIG. 20(b)), it is in the BHC state and unevenness on the end surface has occurred (the right end in FIG. 20(b)), and the like. In addition, regarding the unevenness on the end surface, an unevenness level can also be expressed depending on the meandering condition of the crack (the right end in FIG. 20(b)). In this manner, the control unit 8 may control the display 150 so as to display the estimated processing result image of a cross section perpendicular to the processing line irradiated with laser light.

FIG. 21(a) illustrates actual states of diverse cross sections, and FIG. 21(b) illustrates estimated processing result images of a cross section horizontal to the processing line when the cross section illustrated in FIG. 21(a) is obtained. FIGS. 21(a) and 21(b) illustrate states which are vertically corresponding to each other. As illustrated in FIG. 21(b), in the estimated processing result image of a cross section horizontal to the processing line, for example, a modified region (SD layer) is displayed in a belt shape. In the image of a cross section horizontal to the processing line, since the modified region can be expressed for each pulse, an image of a pulse pitch can be displayed. Since cracks are displayed in a surface instead of lines, they are distinguished from each other by the difference or the like in color. According to such an estimated processing result image, it is possible to visually express that it is in the BHC state (the left end in FIG. 21(b)), it is in the ST state and the crack is disconnected in the middle (the second from the left in FIG. 21(b)), it is in the BHC state and the crack is disconnected in the middle (the second from the right in FIG. 21(b)), it is in the BHC state and unevenness on the end surface has occurred (the right end in FIG. 21(b)), and the like. The unevenness on the end surface can be expressed by a meandering region of the crack (the right end in FIG. 20(b)). In this manner, the control unit 8 may control the display 150 so as to display the estimated processing result image of a cross section horizontal to the processing line irradiated with laser light.

(Processing Treatment)

In processing treatment, the control unit 8 controls the laser irradiation unit 3 such that the wafer 20 is irradiated with laser light under the determined processing conditions (recipes). Specifically, the control unit 8 controls the laser irradiation unit 3 so as to form a modified region and a crack extending from the modified region in the wafer 20 by irradiating the wafer 20 with laser light. The control unit 8 starts the processing treatment in accordance with "processing start" (refer to FIG. 19) pressed down in the display 150.

(Processing Result Acquiring Treatment)

In the processing result acquiring treatment, the control unit 8 acquires a laser processing result of the wafer 20 through irradiation with laser light by controlling the imaging unit 4 such that the processed wafer is imaged. Specifically, the control unit 8 acquires a laser processing result including information of a modified region and a crack extending from the modified region formed on the wafer 20 through irradiation with laser light by outputting light having transmission properties with respect to the wafer 20 and controlling the imaging unit 4 so as to image the wafer 20.

As described above, after the laser processing, each process of inspection selected by a user (refer to FIG. 19) is executed. In each process of inspection, E: wafer thickness inspection (derivation of the wafer thickness) will be described with reference to FIGS. 22 and 23. In the inspection device 1, the thickness of the wafer 20 can be measured on the basis of the information obtained through laser processing by the laser irradiation unit 3 and the process of internal observation by the imaging unit 4. Specifically, the control unit 8 executes first treatment for controlling the laser irradiation unit 3 so as to form a modified region inside the wafer 20 by irradiating the wafer 20 with laser light, and second treatment for deriving a position of the modified region on the basis of a signal output from the imaging unit 4 which has detected light propagated in the wafer 20 and deriving the thickness of the wafer 20 on the basis of the derived position of the modified region and the set recipes (processing conditions).

Figure 22:
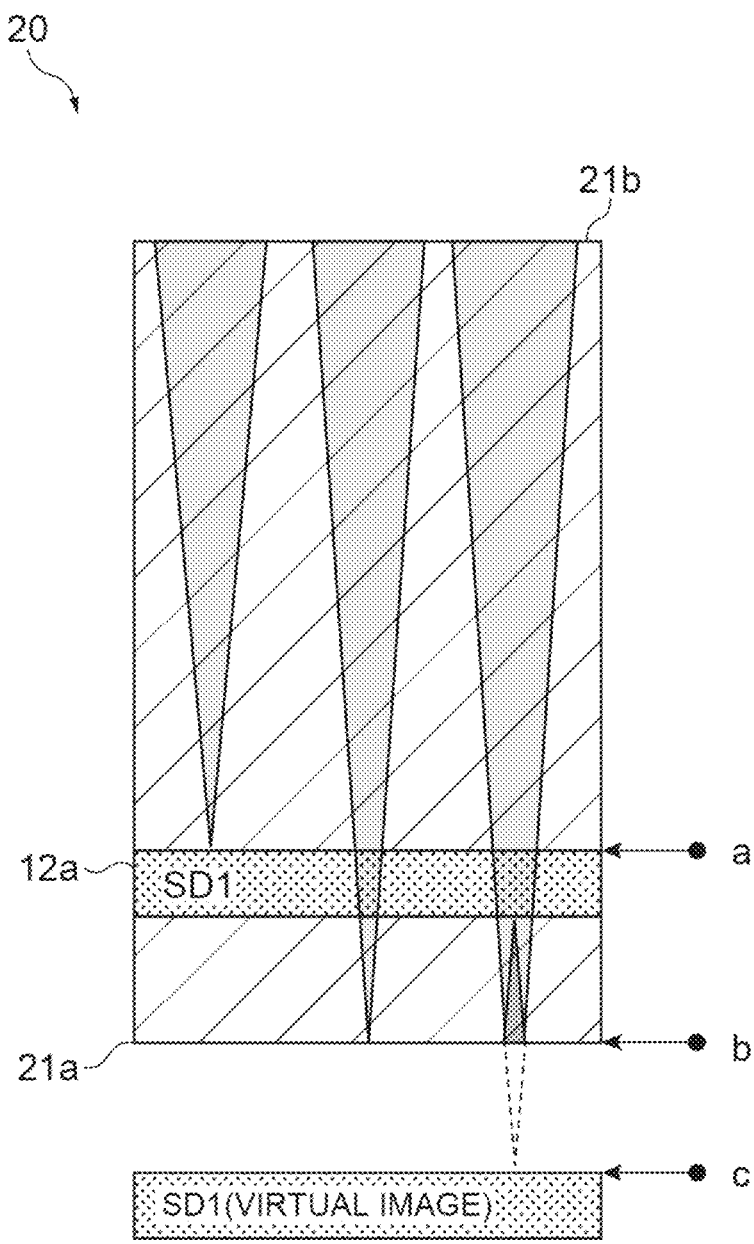
FIG. 22 is an explanatory view of derivation of a wafer thickness.

FIG. 22 is an explanatory view of derivation of a wafer thickness. FIG. 22 illustrates that the modified region 12a is formed by irradiating the wafer 20 with laser light from the rear surface 21b side thereof. The control unit 8 controls the imaging unit 4, acquires a plurality of images by moving the focal point F in a depth direction (Z direction), and derives a: Z position of the upper end of the modified region 12a (SD1) and c: Z position of the end portion of the modified region 12a (SD1) on the front surface 21a side in a virtual image from the images. That is, in the second treatment described above, the control unit 8 derives the Z position (position a) of the end portion of the modified region 12a on the rear surface 21b side and the Z position (position c) of the end portion of the modified region 12a on the front surface 21a side in a virtual image on the basis of a signal output from the imaging unit 4 which has detected light. In addition, when the wafer 20 is a wafer having the functional element layer 22 (pattern), the control unit 8 can move the focal point F in the depth direction (Z direction) by controlling the imaging unit 4 and can derive b: Z position on the pattern surface. Hereinafter, these Z positions will be regarded as positions having the rear surface 21b of the wafer 20 as a reference point. For example, the Z position of the wafer which is a reference point may be derived by recognizing a crack extended on the rear surface 21b side using the imaging unit 4 (detector for internal observation) or a visible camera for height setting, may be derived by recognizing it using a visible camera for height setting when the Z height is set before the laser processing, or may be derived by measuring the focal position of the pattern during alignment before the laser processing or during internal observation after laser processing when laser light is incident from the pattern surface.

The control unit 8 can derive the thickness of the wafer 20 using three patterns of deriving techniques. In a first technique, the control unit 8 derives the thickness of the wafer 20 on the basis of b: Z position on the pattern surface. The first technique can be used only when the wafer 20 as described above is a wafer having the functional element layer 22 (pattern). In a second technique and a third technique, the control unit 8 derives the thickness of the wafer 20 on the basis of c: Z position of the end portion of the modified region 12a (SD1) on the front surface 21a side in a virtual image and the recipes.

In the second technique, the control unit 8 first derives the width of the modified region 12a on the basis of the recipes. Specifically, for example, as illustrated in FIG. 23, the control unit 8 stores a database related to derivation of the wafer thickness (a database in which the processing conditions and the width of the modified region are associated with each other), and with reference to the database, the control unit 8 derives an energy of laser light, a pulse waveform, a pulse pitch, and a width of the modified region 12a (a width of the SD layer) corresponding to a light concentration state which are shown in the recipes (processing conditions). Further, the control unit 8 derives the thickness of the wafer on the basis of the derived width of the modified region 12a, c: Z position of the end portion of the modified region 12a (SD1) on the front surface 21a side in a virtual image, a: Z position of the upper end of the modified region 12a (SD1). As illustrated in FIG. 22, when the derived width of the modified region 12, c: Z position of the end portion of the modified region 12a (SD1) on the front surface 21a side in a virtual image, and a: Z position of the upper end of the modified region 12a (SD1) are added, the value thereof becomes twice the thickness of the wafer 20. For this reason, the control unit 8 can derive the thickness of the wafer 20 by dividing the added value of the width of the modified region 12, c: Z position of the end portion of the modified region 12a (SD1) on the front surface 21a side in a virtual image, and a: Z position of the upper end of the modified region 12a (SD1) in half.

In the third technique, the control unit 8 first derives an estimated end portion position which is a position of the end portion of the modified region 12a on the front surface 21a side estimated from the Z height which is a processing depth of laser light with respect to the wafer 20 on the basis of the recipes. The control unit 8 derives a position of the end portion in consideration of a DZ rate (a position of the end portion of the modified region 12a on the front surface 21a side in consideration of the DZ rate) on the basis of the estimated end portion position and a constant (DZ rate) in consideration of the refractive index of silicon of the wafer 20, and derives the thickness of the wafer 20 on the basis of the position of the end portion in consideration of the DZ rate and c: Z position of the end portion of the modified region 12a (SD1) on the front surface 21a side in a virtual image. As illustrated in FIG. 22, when the position of the end portion in consideration of the DZ rate and c: Z position of the end portion of the modified region 12a (SD1) on the front surface 21a side in a virtual image described above are added, the value thereof becomes twice the thickness of the wafer 20. For this reason, the control unit 8 can derive the thickness of the wafer 20 by dividing the added value of the position of the end portion in consideration of the DZ rate and c: Z position of the end portion of the modified region 12a (SD1) on the front surface 21a side in a virtual image described above in half.

Figure 24:
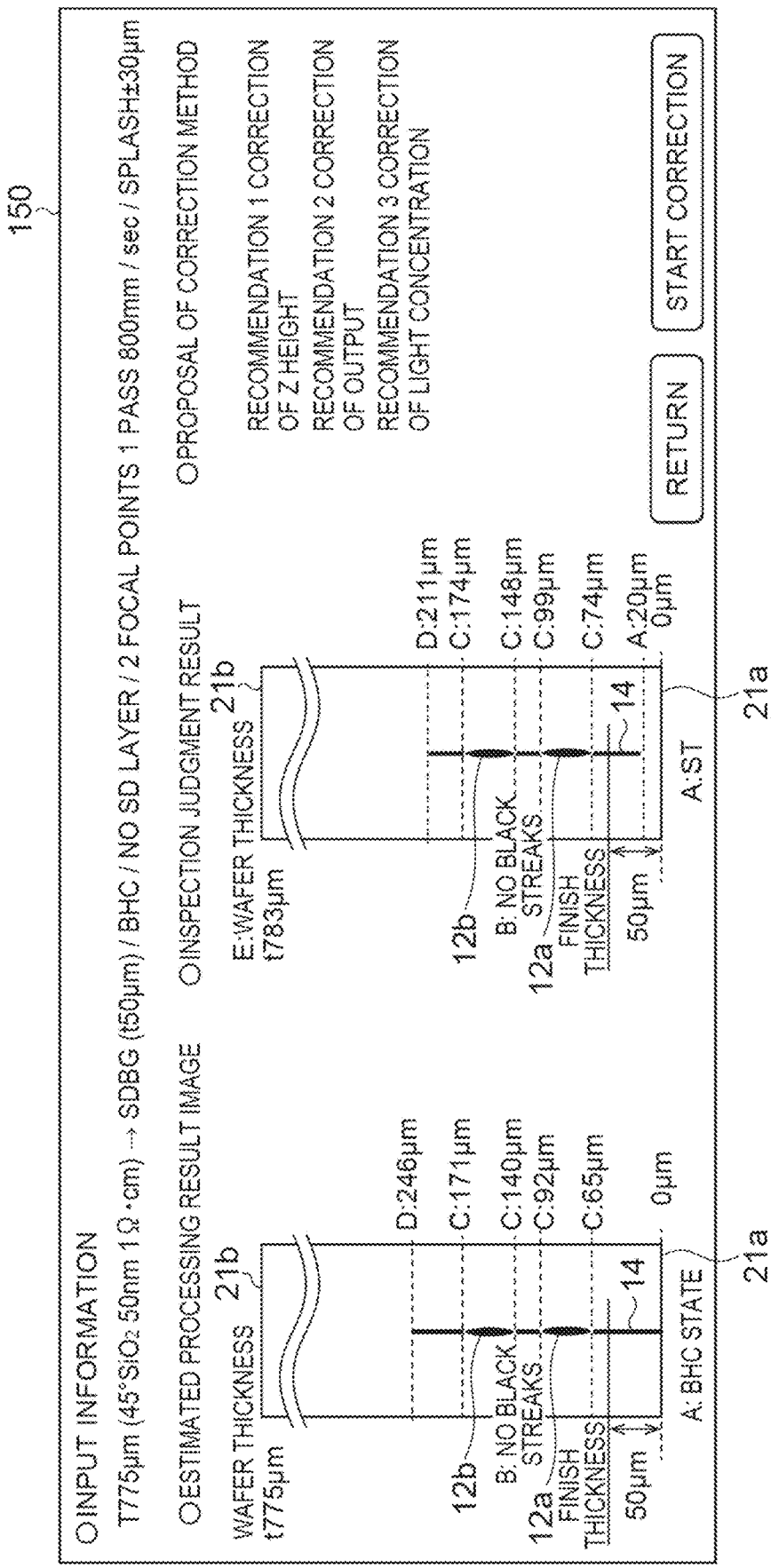
FIG. 24 is an example of a display screen of an inspection judgment result (NG).

A judgment result of each process of inspection includes information of the laser processing result acquired by the control unit 8. Hereinafter, "inspection judgment result" will be described as including information of "a laser processing result". FIG. 24 is an example of a display screen of an inspection judgment result (NG). As illustrated in FIG. 24, the control unit 8 controls the display 150 so as to display the inspection judgment result including information of the laser processing result. As illustrated in FIG. 24, the control unit 8 may control the display 150 so as to display both the estimated processing result image and the inspection judgment result including information of the laser processing result associated with each other.

As illustrated in FIG. 24, the estimated processing result image of the display 150 show A: BHC state (being in a state of BHC), B: no black streak (no black streak is generated), C: 65 μm, 92 μm, 140 μm, and 171 μm (the lower end target position of the modified region 12a is 65 μm, the upper end target position of the modified region 12a is 92 μm, the lower end target position of the modified region 12b is 140 μm, and the upper end target position of the modified region 12b is 171 μm based on the front surface 21a), D: 246 μm (the upper end target position of the crack 14 extending from the modified region 12b toward the rear surface 21b is 246 μm based on the front surface 21a), E: wafer thickness t775 μm (the wafer thickness is 775 μm), the finish thickness is 50 μm. It is assumed that the state of the estimated processing result image is obtained when the laser processing is performed in accordance with the recipes. However, the inspection judgment result shows A: ST (being in a state of ST), B: no black streak, C: 74 μm, 99 μm, 148 μm, and 174 μm (the lower end position of the modified region 12a is 74 μm, the upper end position of the modified region 12a is 99 μm, the lower end position of the modified region 12b is 148 μm, and the upper end position of the modified region 12b is 174 μm based on the front surface 21a), D: 211 μm (the upper end position of the crack 14 extending from the modified region 12b toward the rear surface 21b is 211 μm based on the front surface 21a), E: wafer thickness t783 μm (the wafer thickness is 783 μm), and the finish thickness is 50 μm.

(Processing Condition Evaluating Treatment)

The control unit 8 evaluates the recipes (processing conditions) on the basis of the inspection judgment result (refer to FIG. 24) including information of the laser processing result. Specifically, the control unit 8 evaluates the validity of the recipes by comparing the inspection judgment result including information of the laser processing result and the estimated processing result in consideration of the recipes determined on the basis of the wafer processing information. At present, as illustrated in FIG. 24, there is a divergence between a target value of the estimated processing result image and a value of the inspection judgment result, NG is marked for at least A: BHC inspection, C: SD layer position inspection, D: upper crack position inspection, and E: wafer thickness inspection in each process of inspection (refer to FIG. 19) selected by a user. Regarding the cause for being in a state of ST instead of BHC, it is conceivable that since E: wafer thickness t783 μm is in the inspection judgment result, the wafer thickness (775 μm) set by a user is not correct and the wafer 20 is thicker than assumed so that the formation position of the modified region is shifted in a shallow direction, the modified region has become thinner than assumed, and the like. In such a case, the control unit 8 evaluates the recipes (processing conditions) to be inappropriate. The control unit 8 may judge whether the cause for a positional deviation of the modified region (SD layer) is caused by hardware or caused by the recipes on the basis of different data such as AF followability. Here, an example in which the cause for inspection NG is the wafer thickness has been described, but it is conceivable that inspection NG results from diverse causes such as a hardware difference, an insufficient margin of the recipes on the database, and a dope of the wafer.

When the recipes (processing conditions) are evaluated to be inappropriate, the control unit 8 may further execute correcting of the recipes (processing conditions) on the basis of the inspection judgment result including information of the laser processing result. For example, when it is conceivable that the wafer 20 thicker than assumed is the cause for the inspection NG as described above, the control unit 8 performs correction of the Z height, correction of an output, and correction of the light concentration correction amount, and determines correction of the recipes during the BHC margin inspection as details of correction. As illustrated in FIG. 24, the control unit 8 controls the display 150 so as to display the details of recommended correction together with the inspection judgment result. The control unit 8 may control the display 150 so as to display a preference order of each of the details of correction. The display 150 may receive a user's input such as change of the preference order and deletion of a part of the details of correction. The control unit 8 starts treatment of correction displayed in the display 150 in accordance with "correction start" (refer to FIG. 24) pressed down in the display 150. In the case of the situation described above (the wafer is thicker than assumed), for example, the width of the modified region is ensured by performing change of lowering the Z height to a deeper position as much as the wafer thickness or correction of change or the like of increasing the output by 0.1 W. Further, for example, when there is a small margin as a result of the BHC margin inspection, light concentration properties are enhanced by adjusting the light concentration correction amount. Through such treatment, the control unit 8 derives ultimate (after correction) recipes.

Figure 25:
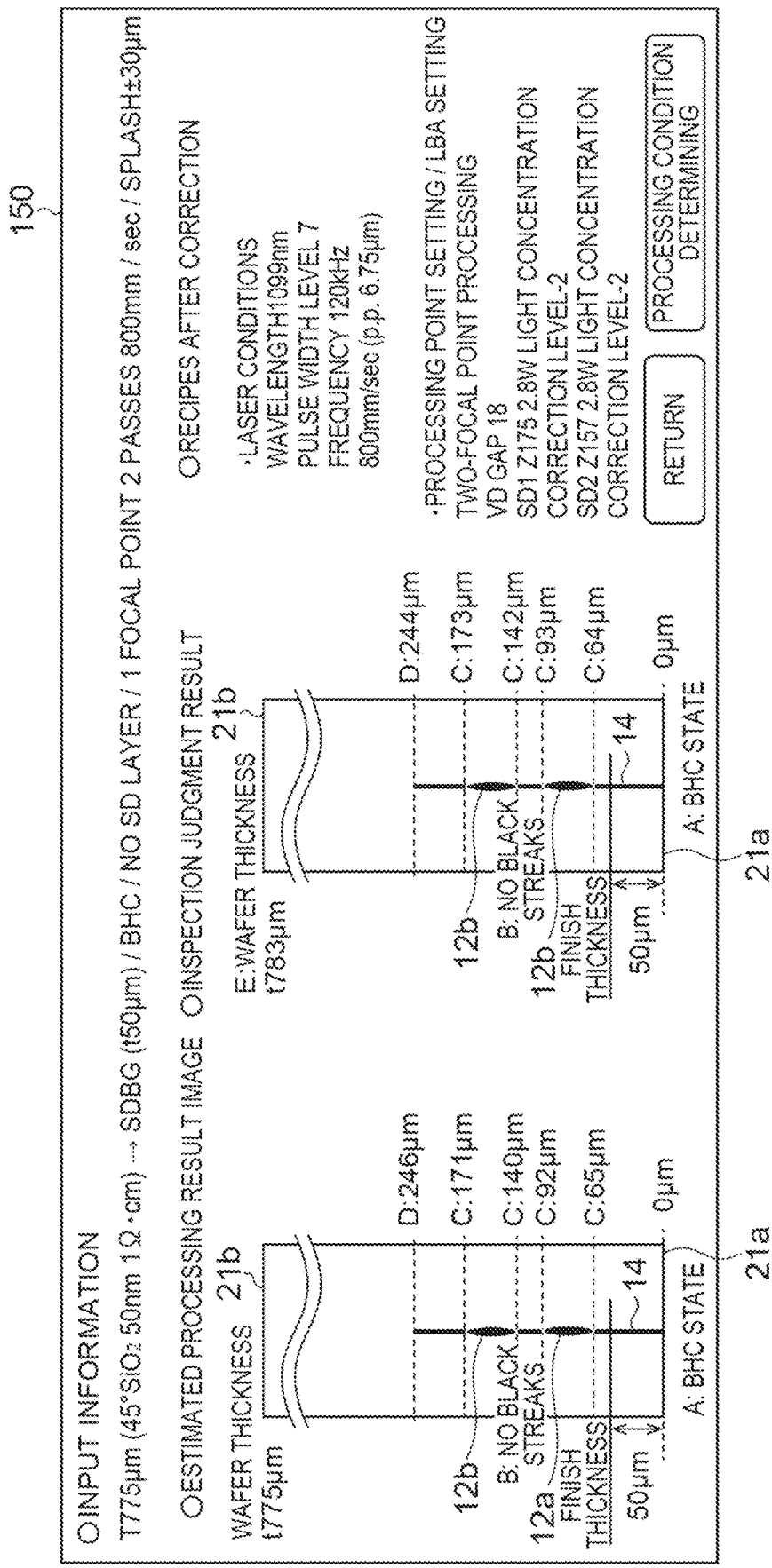
FIG. 25 is an example of a display screen of an inspection judgment result (OK).

FIG. 25 is an example of a display screen of an inspection judgment result (OK). As illustrated in FIG. 25, after correction is performed, the control unit 8 controls the display 150 so as to display the estimated processing result image, the inspection judgment result, and the recipes after corrections (processing conditions) together. In the example of FIG. 25, the inspection judgment result shows A: BHC (being in a state of BHC), B: no black streak, C: 64 µm, 93 µm, 142 µm, and 173 µm (the lower end position of the modified region 12*a* is 64 µm, the upper end position of the modified region 12*a* is 93 µm, the lower end position of the modified region 12*b* is 142 µm, and the upper end position of the modified region 12*b* is 173 µm based on the front surface 21*a*), D: 244 µm (the upper end position of the crack 14 extending from the modified region 12*b* toward the rear surface 21*b* is 244 µm based on the front surface 21*a*), E: wafer thickness t783 µm (the wafer thickness is 783 µm), and the finish thickness is 50 µm. In this manner, the judgment result of each process of inspection is OK by performing correction in consideration of the wafer thickness different from that assumed. Further, when the recipes (processing conditions) are corrected, the control unit 8 updates the database in which the wafer processing information and the processing conditions (the recipes) described above are stored in association with each other on the basis of information including the recipes after correction. For example, when recipes for the wafer thickness (783 µm) shown in the inspection judgment result are not present in the database, the control unit 8 newly registers the recipes after correction in the database as the recipes for the wafer thickness (783 µm). When recipes are newly registered in the database, an original wafer of a user or the name of the processing conditions can be registered. Accordingly, when a similar wafer is processed, the recipes in the database can be imported based on the name. In addition, the control unit 8 improves the accuracy in determining next recipes and thereafter by storing the results of the inspection NG in the database.

[Inspection Method]

Figure 26:
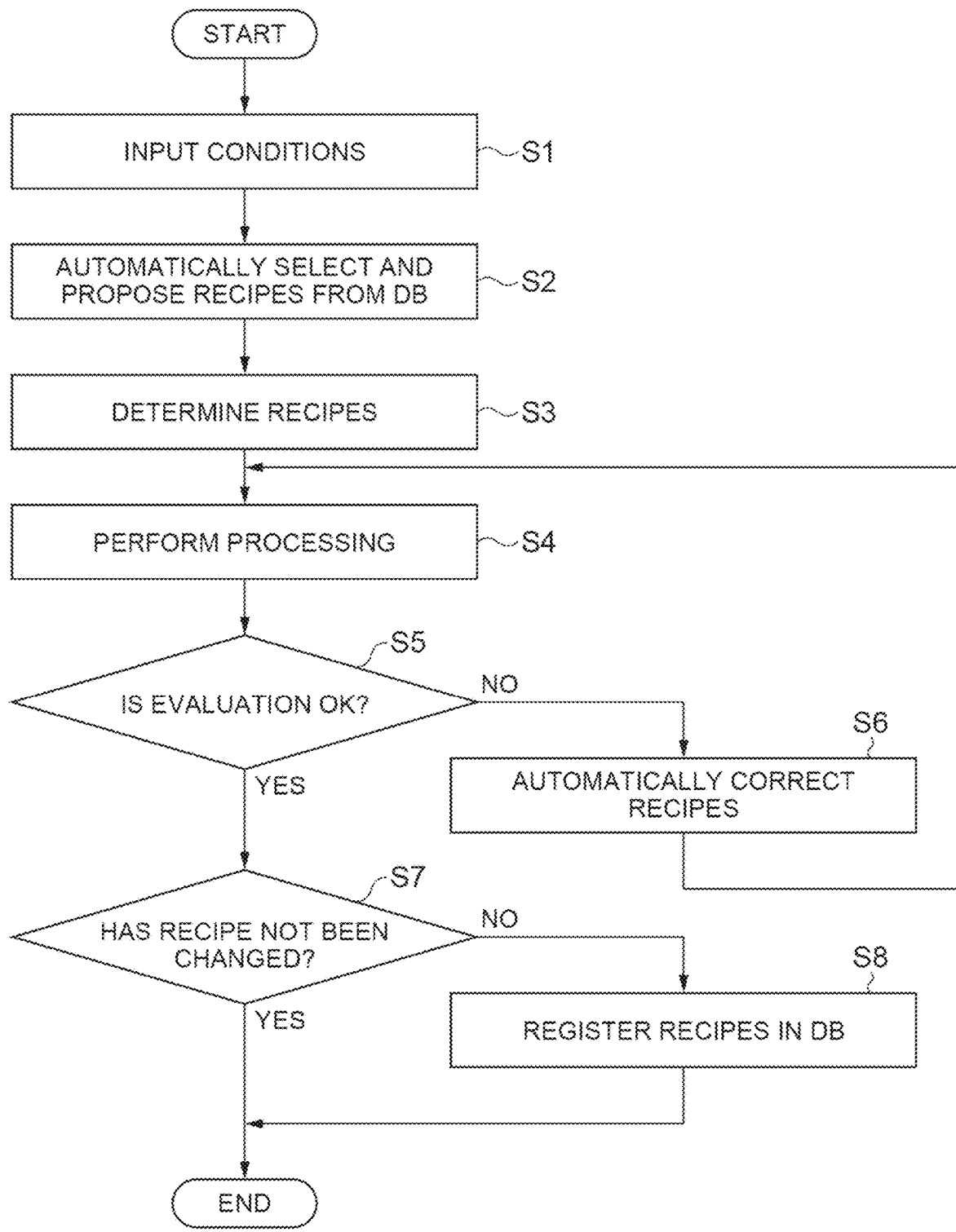
FIG. 26 is a flowchart of an inspection method.

An inspection method of the present embodiment will be described with reference to FIG. 26. FIG. 26 is a flowchart of an inspection method. FIG. 26 is a flowchart showing processing condition deriving treatment performed as pretreatment of treatment for forming a modified region in the wafer 20 in the inspection methods executed by the inspection device 1.

As illustrated in FIG. 26, in the processing condition deriving treatment, first, the display 150 receives a user's input of information of the wafer 20 and the wafer processing information including the laser processing target with respect to the wafer 20 (Step S1, first step). Specifically, the display 150 receives a user's input of the processing method illustrated in FIG. 13, the wafer information illustrated in FIG. 14, and the processing setting illustrated in FIG. 15.

Subsequently, with reference to the database, the control unit 8 determines (automatic selection) the recipes (processing conditions) corresponding to the wafer processing information received by the display 150 (various kinds of information received in the setting screens of FIGS. 13 to 15) and controls the display 150 so as to display (propose) the automatically selected recipes (Step S2, second step). The display 150 displays the recipes, the estimated processing result image, the inspection conditions, and the like (refer to FIG. 19). Further, the recipes are determined by a user pressing down "processing start" in the display 150 (Step S3), and the processing treatment of irradiating the wafer 20 with laser light on the basis of the determined recipes is started (Step S4, third step).

Subsequently, the control unit 8 evaluates the recipes (processing conditions) on the basis of the inspection judgment result including information of the laser processing result (refer to FIG. 24) (fourth step) and judges whether or not the recipes are appropriate (whether the evaluation is OK) (Step S5). In Step S5, when it is judged that the recipes are inappropriate (evaluation is NG), the recipes are automatically corrected on the basis of the inspection judgment result (Step S6). For example, when it is conceivable that the wafer 20 being thicker than assumed is the cause for NG, the control unit 8 performs correction of the Z height, correction of an output, correction of the light concentration correction amount, and the like. Thereafter, the processing treatment of Step S4 is performed again.

On the other hand, in Step S5, when it is judged that the recipes are appropriate (evaluation is OK), it is judged whether or not the recipes are not changed even once (whether or not the correction treatment of Step S6 has not performed even once) (Step S7), and when the recipes have been changed, the recipes after change (new recipe) are registered in the database (Step S8), and the treatment ends.

[Operational Effects]

Next, operational effects of the inspection device 1 according to the present embodiment will be described.

The inspection device 1 of the present embodiment includes the laser irradiation unit 3 which irradiates the wafer 20 with laser light, the display 150 which displays information, and the control unit 8. The control unit 8 is constituted to execute deriving of the estimated processing result including information of a modified region and a crack extending from the modified region formed on the wafer 20 when the wafer 20 is irradiated with laser light by the laser irradiation unit 3 on the basis of set recipes (processing conditions), and controlling of the display 150 so as to display an estimated processing result image depicting both a graphic image of the wafer 20 and a graphic image of the modified region and the crack in the wafer 20 in consideration of positions of the modified region and the crack in the wafer 20 derived as the estimated processing result.

In the inspection device 1, an estimated processing result image depicting both the wafer 20, and a modified region and a crack of the wafer 20 are displayed in consideration of the estimated processing result including information of a modified region and a crack extending from the modified region formed on the wafer 20 through irradiation with laser light on the basis of set recipes. Since an estimated processing result image is displayed in this manner, when the wafer 20 is processed in accordance with set recipes, it is possible to inform a user how the wafer is processed (how a modified region and a crack are formed). Consequently, a user can visually confirm the estimated processing result image and can determine whether to perform actual processing without any change or to change the processing conditions. Accordingly, it is possible to efficiently determine recipes and easily perform processing desired by a user.

In the inspection device 1 described above, the display 150 may receive an input of information related to setting of the recipes. The control unit 8 may set the recipes on the basis of information related to setting of the recipes received by the display 150. Accordingly, since the recipes are set on the basis of information received from a user, for example, it is possible to set appropriate recipes in consideration of information of the wafer 20, and a laser processing target with respect to the wafer 20, and the like.

The control unit 8 may control the display 150 so as to display both the recipes and the estimated processing result image associated with each other. Accordingly, it is possible to visually inform a user of a certain processing result obtained when processing is performed under certain recipes.

The display 150 may receive an input of the first corrected information related to correction of positions of the modified region and the crack displayed as the estimated processing result image in a state where the estimated processing result image is displayed. The control unit 8 may correct the estimated processing result on the basis of the first corrected information and correct the recipes so as to obtain the estimated processing result after correction, and may control the display 150 so as to display both the recipes after correction and the estimated processing result image based on the estimated processing result after correction associated with each other. Accordingly, it is possible to easily correct the recipes on the basis of a correction instruction for an estimated processing result image from a user who has confirmed the estimated processing result image. When a correction instruction for an estimated processing result image is output so as to obtain a desired processing result, since processing conditions are automatically corrected to the recipes corresponding thereto, a user can easily perform desired processing.

The display 150 may receive an input of the second corrected information related to correction of the recipes in a state where the recipes are displayed. The control unit may correct the recipes on the basis of the second corrected information and correct the estimated processing result on the basis of the recipes after correction, and may control the display 150 so as to display both the recipes after correction and the estimated processing result image based on the estimated processing result after correction associated with each other. Accordingly, it is possible to easily correct the recipes on the basis of a correction instruction from a user, and it is possible to appropriately display the estimated processing result image in the case of the recipes after correction.

The inspection device 1 further includes the imaging unit 4 which images the wafer 20. The control unit 8 may be constituted to further execute controlling of the laser irradiation unit 3 so as to form a modified region and a crack extending from the modified region in the wafer 20 by irradiating the wafer 20 with laser light, acquiring of the laser processing result including information of a modified region and a crack extending from the modified region formed on the wafer 20 through irradiation with laser light by outputting light having transmission properties with respect to the wafer 20 and controlling the imaging unit 4 so as to image the wafer 20, and controlling of the display 150 so as to display both the estimated processing result image and the laser processing result associated with each other. Accordingly, it is possible to display both an image of processing estimated from the recipes and an actual laser processing result, and it is possible for a user to easily judge whether or not to change the recipes, and the like.

The control unit 8 may control the display 150 so as to display the estimated processing result image of a cross section perpendicular to the processing line irradiated with laser light. Accordingly, it is possible for a user to confirm the estimated processing result image of a cross section perpendicular to the processing line.

The control unit 8 may control the display 150 so as to display the estimated processing result image of a cross section horizontal to the processing line irradiated with laser light. Accordingly, it is possible for a user to confirm the estimated processing result image of a cross section horizontal to the processing line.

Figure 27:
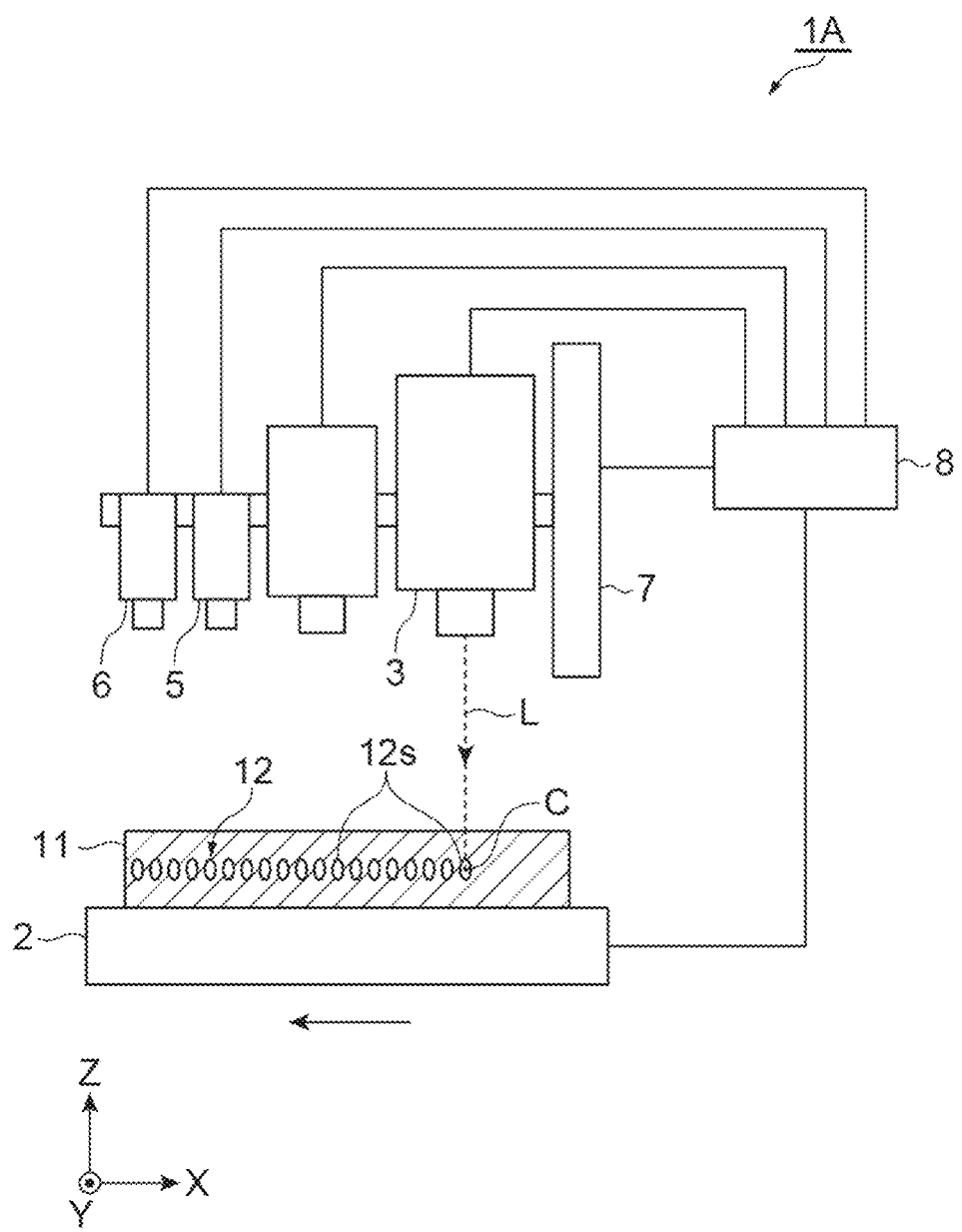
FIG. 27 is a view of a constitution of an inspection device according to a modification example.

Hereinabove, the present embodiment has been described, but the present invention is not limited to the foregoing embodiment. For example, as illustrated in FIG. 1, the inspection device 1 has been described as having the display 150 displaying the estimated processing result image and the like, but the constitution is not limited thereto. As in an inspection device 1A illustrated in FIG. 27, a display may not be provided. The inspection device 1A has a constitution similar to that of the inspection device 1 except that a display is not provided. In this case, for example, the control unit 8 of the inspection device 1A outputs (transmits) an estimated processing result image depicting both a graphic image of a wafer and a graphic image of a modified region and the crack in the wafer in consideration of positions of the modified region and the crack in the wafer derived as the estimated processing result to an external device or the like. Further, the estimated processing result image and the like may be displayed in an external device instead of the inspection device 1A. That is, the estimated processing result image and the like may be displayed in a different device (PC or the like) which can communicate with the inspection device 1A. Accordingly, even in such a case where the inspection device 1A has no display, it is possible to display the estimated processing result image or the like using a different device or the like which can communicate with the inspection device 1A.

Figure 28:
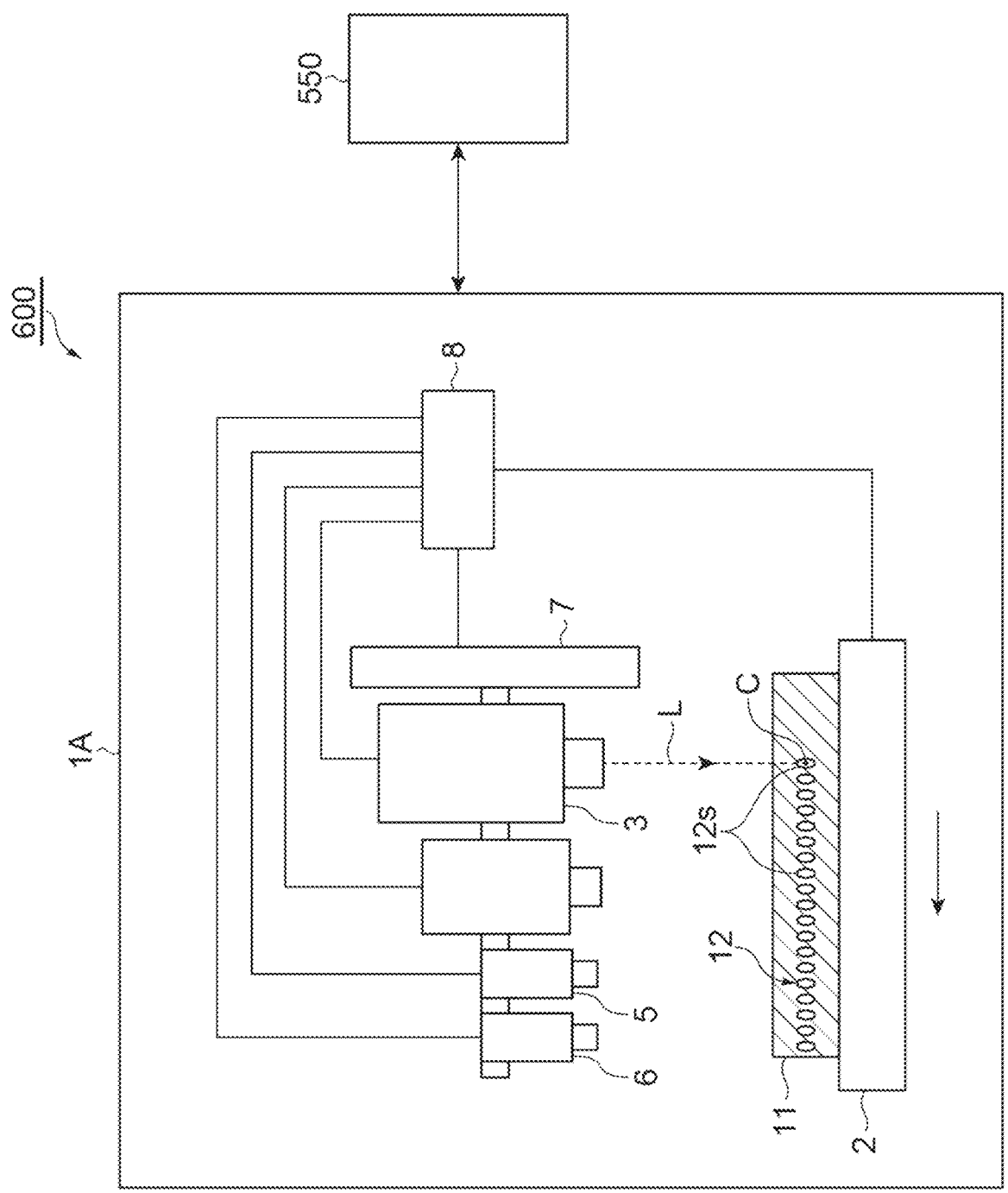
FIG. 28 is a view of a constitution of a treatment system according to a modification example.

In addition, as illustrated in FIG. 28, in a treatment system 600 having the inspection device 1A described above and a dedicated display device 550, the estimated processing result image may be generated and displayed. In this case, for example, the control unit 8 of the inspection device 1A transmits an estimated processing result image or the like depicting both a graphic image of a wafer and a graphic image of a modified region and a crack in the wafer to the display device 550 in consideration of positions of the modified region and the crack in the wafer derived as the estimated processing result. The display device 550 displays the estimated processing result image and the like received from the inspection device 1A. According to such a treatment system 600, the estimated processing result image and the like transmitted by the inspection device 1A can be appropriately displayed in the display device 550 which is an external device.

In addition, in the embodiment, the display has been described as displaying an estimated processing result image depicting both a graphic image of a wafer and a graphic image of a modified region and a crack in the wafer, but the constitution is not limited thereto. That is, the control unit may not necessarily display the estimated processing result image described above in the display. For example, the control unit may derive the estimated processing result including information of a modified region and a crack extending from the modified region formed on the wafer and may control the display so as to display information related to the estimated processing result. Information related to the estimated processing result may not be a graphic image of a wafer, a modified region, a crack, or the like, and it may be simply information or the like indicating positions of a modified region and a crack (that is, the graphic image may not be included therein).

In addition, in the processing condition deriving treatment, displaying treatment of the estimated processing result image described above and deriving treatment of the wafer thickness have been described as being performed, but displaying treatment of the estimated processing result image and the deriving treatment of the wafer thickness may be performed during treatment other than the processing condition deriving treatment, for example, various kinds of treatment after the processing conditions are derived.

In addition, in the embodiment, the inspection device 1 has been described as determining the recipes (processing conditions) on the basis of the wafer processing information and derives the estimated processing result, but the constitution is not limited thereto. That is, the control unit of the inspection device may derive the estimated processing result on the basis of the wafer processing information and may determine the recipes (processing conditions) on the basis of the estimated processing result. In this manner, when the processing conditions are automatically determined by inputting the wafer processing information, for example, compared to a case where laser processing treatment is repeatedly performed and appropriate processing conditions are derived while a user adjusts the processing conditions, it is possible to easily determine the processing conditions.

REFERENCE SIGNS LIST 1, 1A Inspection device
3 Laser irradiation unit
4 Imaging unit
8 Control unit
20 Wafer
150 Display

The invention claimed is:

1. An inspection device comprising:
an irradiation unit that irradiates a wafer with laser light;
a display unit that displays information; and
a control unit, including at least one processor, that:
derives an estimated processing result including information of a modified region and a crack extending from the modified region formed on the wafer when the wafer is irradiated with the laser light by the irradiation unit on the basis of set processing conditions,
generates estimated processing result image based on the estimated processing result, and
controls the display unit to display the estimated processing result image, the estimated processing result image depicting both a graphic image of the wafer and a graphic image of the modified region and the crack in the wafer in consideration of positions of the modified region and the crack in the wafer derived as the estimated processing result.

2. The inspection device according to claim 1 further comprising:
an input unit configured to receive an input of information,
wherein the input unit receives an input of information related to setting of the processing conditions, and
wherein the control unit sets the processing conditions on the basis of information related to setting of the processing conditions received by the input unit.

3. The inspection device according to claim 2,
wherein the control unit controls the display unit to display both the processing conditions and the estimated processing result image associated with each other.

4. The inspection device according to claim 3,
wherein the input unit receives an input of first corrected information related to correction of positions of the modified region and the crack displayed as the estimated processing result image in a state where the estimated processing result image is displayed by the display unit, and
wherein the control unit further:
corrects the estimated processing result on the basis of the first corrected information and corrects the processing conditions to obtain the estimated processing result after correction, and
controls the display unit to display both the processing conditions after correction and the estimated processing result image based on the estimated processing result after correction associated with each other.

5. The inspection device according to claim 3,
wherein the input unit receives an input of second corrected information related to correction of the processing conditions in a state where the processing conditions are displayed by the display unit, and
wherein the control unit further:
corrects the processing conditions on the basis of the second corrected information and corrects the estimated processing result on the basis of the processing conditions after correction, and
controls the display unit to display, based on the image of the wafer, both the processing conditions after correction and the estimated processing result image based on the estimated processing result after correction associated with each other.

6. The inspection device according to claim 1
an imaging unit that images the wafer,
wherein the control unit further:
controls the irradiation unit to form a modified region and a crack extending from the modified region in the wafer by irradiating the wafer with the laser light,
acquires a laser processing result including information of a modified region and a crack extending from the modified region formed on the wafer through irradiation with the laser light by outputting light having transmission properties with respect to the wafer and controlling the imaging unit to image the wafer, and controlling of the display unit to display both the estimated processing result image and the laser processing result associated with each other.

7. The inspection device according to claim 1, wherein the control unit controls the display unit to display the estimated processing result image of a cross section perpendicular to a processing line irradiated with the laser light.

8. The inspection device according to claim 1, wherein the control unit controls the display unit to display the estimated processing result image of a cross section horizontal to a processing line irradiated with the laser light.

9. An inspection device comprising:
an irradiation unit irradiates a wafer with laser light; and
a control unit, including at least one processor, that:
derives an estimated processing result including information of a modified region and a crack extending from the modified region formed on the wafer when the wafer is irradiated with the laser light by the irradiation unit on the basis of set processing conditions,
generates estimated processing result image based on the estimated processing result, and
outputs the estimated processing result image, the estimated processing result image depicting both a graphic image of the wafer and a graphic image of the modified region and the crack in the wafer in consideration of positions of the modified region and the crack in the wafer derived as the estimated processing result.

10. A treatment system performing communication between an inspection device and a display device, wherein the inspection device, including at least one processor, that:
derives an estimated processing result including information of a modified region and a crack extending from the modified region formed when a wafer is irradiated with the laser light on the basis of set processing conditions,
generates estimated processing result image based on the estimated processing result, and
outputs the estimated processing result image, the estimated processing result image depicting both a graphic image of the wafer and a graphic image of the modified region and the crack in the wafer toward the display device in consideration of positions of the modified region and the crack in the wafer derived as the estimated processing result,
wherein the display device displays the estimated processing result image output by the inspection device.

11. An inspection device comprising:
an irradiation unit that irradiates a wafer with laser light;
a display unit that displays information; and
a control unit, including at least one processor, that:
derives an estimated processing result including information of a modified region and a crack extending from the modified region formed on the wafer when the wafer is irradiated with the laser light by the irradiation unit on the basis of set processing conditions, and
controls the display unit to display information related to the estimated processing result.

* * * * *